United States Patent
Kono et al.

(10) Patent No.: US 7,110,282 B2
(45) Date of Patent: Sep. 19, 2006

(54) SEMICONDUCTOR MEMORY DEVICE ALLOWING ACCURATE BURN-IN TEST

(75) Inventors: Takashi Kono, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 99 days.

(21) Appl. No.: 10/947,213

(22) Filed: Sep. 23, 2004

(65) Prior Publication Data

US 2005/0068838 A1 Mar. 31, 2005

(30) Foreign Application Priority Data

Sep. 26, 2003 (JP) .............................. 2003-335763

(51) Int. Cl.
| | |
|---|---|
| G11C 11/4063 | (2006.01) |
| G11C 11/4074 | (2006.01) |
| G11C 7/08 | (2006.01) |
| G11C 8/08 | (2006.01) |
| G11C 8/12 | (2006.01) |
| G11C 8/14 | (2006.01) |
| H01L 29/772 | (2006.01) |

(52) U.S. Cl. ................. 365/149; 365/230.03; 365/196; 365/189.11; 365/230.06; 257/391; 257/392

(58) Field of Classification Search ................ 365/201, 365/149, 195, 196, 189.11, 230.06, 230.03; 257/392, 391
See application file for complete search history.

(56) References Cited

U.S. PATENT DOCUMENTS

| | | | | |
|---|---|---|---|---|
| 5,751,651 | A | * | 5/1998 | Ooishi ........................ 365/226 |
| 5,998,828 | A | * | 12/1999 | Ueno et al. .................. 257/315 |
| 6,649,984 | B1 | * | 11/2003 | Noda et al. .................. 257/392 |
| 2002/0001246 | A1 | * | 1/2002 | Hidaka ........................ 365/222 |
| 2002/0027256 | A1 | * | 3/2002 | Ishibashi et al. ............ 257/391 |

FOREIGN PATENT DOCUMENTS

| | | |
|---|---|---|
| JP | 7-057465 | 3/1995 |
| JP | 2000-293986 | 10/2000 |
| JP | 2001-068634 | 3/2001 |
| JP | 2002-8370 | 1/2002 |
| KR | 1998-086383 | 5/1998 |

\* cited by examiner

*Primary Examiner*—Anh Phung
*Assistant Examiner*—J. H. Hur
(74) *Attorney, Agent, or Firm*—McDermott Will & Emery LLP

(57) ABSTRACT

An insulated gate type field effect transistor in a memory cell array is a transistor having a gate insulating film which is thicker than a gate insulating film of an insulated gate type field effect transistor in an array peripheral circuit. DRAM (Dynamic Random Access Memory) cell-based semiconductor memory device can be implemented which allows a burn-in test to be accurately performed without degrading sensing operation characteristics even under a low power supply voltage.

6 Claims, 21 Drawing Sheets

SEMICONDUCTOR MEMORY DEVICE ALLOWING ACCURATE BURN-IN TEST

BACKGROUND OF THE INVENTION

1. Field of the Invention

The present invention relates to a semiconductor memory device and, more particularly, to a semiconductor memory device including, as its components, insulated gate type field effect transistors having different gate insulating film thicknesses. More specifically, the present invention relates to a DRAM (Dynamic Random Accesses Memory) cell-based semiconductor memory device.

2. Description of the Background Art

A DRAM cell is formed of a capacitor for storing information in the form of electric charges, and a transistor for accessing the capacitor. A semiconductor memory device (hereinafter, representatively referred to as "DRAM") using such a one-transistor/one-capacitor type DRAM cell is utilized in a wide variety of fields covering a main memory for a computer and a working memory for portable equipment because of its small cell-occupation area and excellent cost-competitiveness owing to advanced miniaturization technology. A server and others utilize a large number of DRAMs. Also, the DRAM is utilized in applications employing a battery as a power source. Thus, there has been a requirement for reduction in power consumption in these applications and therefore, a power supply potential supplied externally has been reduced down to 1.8 V or below.

Conventionally, in match with reduction of an external power supply voltage, a design rule including a gate insulating film thickness Tox of a MOS transistor (insulated gate type field effect transistor) has been scaled down, thereby shrinking a size of such MOS transistor. In a conventional approach, all MOS transistors constituting a DRAM have the same gate insulating film thickness Tox.

However, under the condition of an external power supply voltage being below 1.8 V, there may be a situation where the conventional method can not be utilized. More specifically, for the circuitry which operates on a potential lower than the external power supply voltage, such as a peripheral circuit and a sense amplifier in a memory array, a MOS transistor is required to have a thinner gate insulating film in view of a lower threshold voltage and a higher current driving power. On the other hand, for a memory cell transistor which is supplied with a boosted potential, it is difficult to employ a MOS transistor having the same gate insulating film as that of the MOS transistor in the peripheral circuit, in view of the breakdown voltage of the gate insulating film. On the contrary, if a single type of MOS transistors having a thicker gate insulating film that can ensure the breakdown voltage of the memory cell transistor is employed for the whole of the constituent elements, the threshold voltage increases in absolute value, thereby making it difficult to meet the specification values required in terms of an operation speed.

Therefore, as described in Prior Art Document 1 (Japanese Patent Laying-Open No. 2001-68634), it has been proposed to selectively use a gate insulating film of a MOS transistor according to operation characteristics or the operation potential required for each circuit. A circuit which is supplied with a boosted potential, such as a memory cell transistor, is formed of a MOS transistor having a large gate insulating film thickness Tox1. On the other hand, a circuit which operates on a lower potential than the external power supply potential, such as a peripheral circuit or a sense amplifier, is formed of a MOS transistor having a thinner gate insulating film of a film thickness of Tox2. Such a structure in which MOS transistors having different kinds of gate insulating films are formed is achieved through a "dual oxide" process and is utilized in a system LSI having a logic and a DRAM integrated on a common chip. In the dual oxide process, a MOS transistor having a thick gate insulating film (hereinafter, referred to as "thick film MOS transistor") and a MOS transistor with a thin gate insulating film (hereinafter, referred to as "thin film MOS transistor") are formed in the same process steps, and subsequently the gate insulating film of the thin film MOS transistor is thinned (or all removed) with the thick film MOS transistor masked by a resist. Then, the gate insulating films of the thick film MOS transistor and the thin film MOS transistor are thickened again, through the same process step(s).

Prior Art Document 1 describes, as a conventional art of a semiconductor integrated circuit device having a logic and a DRAM mixedly assembled, the construction in which a peripheral circuit and an in-array circuit of a DRAM core are formed of thick film transistors. In the conventional technique described in Prior Art Document 1, adjustment of an absolute value of a threshold voltage is performed through ion implantation. In order to resolve the problem of an increase in the number of process steps and in the number of masks resulting from the threshold voltage adjustment through ion implantation in the conventional technique, in Prior Art Document 1, a sense amplifier and a column selection gate are formed of thin film transistors and bit line peripheral circuitry, such as a bit line precharging/equalizing circuit and a bit line isolation gate, are formed of thick film MOS transistors, and peripheral circuitry such as a control circuit is formed of thin film MOS transistors.

Further, according to Prior Art Document 1, a thick film MOS transistors having a thick gate insulating film is employed for a memory cell transistor and a word line driving circuit section in a row selection circuit. A circuit for generating an internal power supply voltage performs an analog operation (a current mirror operation and a source follower mode operation) and in this circuit, a thick film MOS transistor having a threshold voltage of a large absolute value is employed in order to suppress influence of off-leakage current to ensure an accurate internal voltage generating operation.

In a column-related circuit and a control circuit in the peripheral circuitry, thin film MOS transistors are employed. A column decoder and a preamplifier/write driver are column-related circuits which operate in a column selecting operation and the number of the column decoders and the preamplifier/writing drivers are small as compared with the number of the circuits related to row selection that are provided in a memory array and the number of unit decode circuits included in a row decoder. Therefore, even if thin film MOS transistors are employed in these column-related circuits, generated off-leakage currents are sufficiently small, thus suppressing the influence on an increase in current consumption in a standby state. On the other hand, by employing thin film MOS transistors in the column-related circuit and the control circuit, these column-related circuit and control circuit operate at high speed even under a condition of low power supply voltage, achieving high speed column access and high speed internal operation.

A sense amplifier circuit placed in a sense amplifier band is formed of thin film MOS transistors, and the necessity of an ion implantation process for threshold voltage adjustment is eliminated. Since the absolute value of the threshold voltage is small and thus the driving power is large, the sense amplifier circuit can be operated at high speed even with a voltage (sense power supply voltage) lower than the external power supply voltage. Further, a column selection gate is formed of a thin film MOS transistor to improve the speed of data transfer with the outside of the memory array.

For the bit line isolation gate and the bit line precharge/equalize circuit, thick film MOS transistors are employed. The bit line isolation gate is supplied with a bit line isolation instruction signal at a high voltage level higher than the array power supply voltage (sense power supply voltage). Therefore, the breakdown characteristics is ensured. The bit line equalizing circuit is provided for each pair of bit lines and is coupled to the sense amplifier circuit through the bit line isolation gate. A bit line equalizing instruction signal is set to the voltage level higher than the array power supply voltage in order to transfer the precharge voltage at high speed. Therefore, the bit line equalizing circuit is formed of a thick film MOS transistor to ensure the breakdown immunity thereof.

In the structure described in Prior Art Document 1, MOS transistors having different gate insulating films are selectively placed according to operation characteristics required for each circuit using the dual oxide process, to achieve appropriate electric characteristics for the respective circuits.

Prior to shipment, the DRAM is subject to the burn-in for testing its reliability by applying high voltage stress to memory cells. There are some kinds of burn-in tests. In Prior Art Document 1, in order to avoid degradation of the reliability of the sense amplifier circuit and the column selection gate circuit formed of thin film MOS transistors due to the high voltage applied during a burn-in test, the high voltage is applied to the memory cells through the bit line equalizing circuits. In this state, the bit line isolation gate is set to a non-conductive state to isolate the bit lines from the sense amplifier circuit and the column selection gate circuit. This prevents the high voltage during the burn-in test from being applied to the thin film MOS transistors in the sense amplifier circuit and the column selection gate circuit.

In a static burn-in mode, all word lines are driven to the selected state, and word lines are supplied with such a boosted potential that allows the potential at a storage node (one-side electrode of the memory capacitor) for storing memory cell data to be set to a sufficiently high voltage level by a high potential applied from the bit line, and allows an appropriate voltage stress to be applied across the gate insulating film of the memory cell transistor. With this static burn-in test, voltage stress required for ensuring the reliability of the memory cells can be applied in a short time period.

However, as described in Prior Art Document 1, in the case of the use of the bit line equalizing circuit for applying voltage stress, the storage nodes of all memory cells are forced to the same voltage level. According to the burn-in voltage applying method, sufficient voltage stress can be applied to a dielectric film between the storage node and a cell plate node of the memory cell capacitor. However, with this method, no voltage stress is applied to an interlayer insulating film between the storage nodes of memory cell capacitors adjacent to each other in the word line direction. In order to apply voltage stress to the interlayer insulating film between the capacitors of memory cells adjacent to each other in the direction perpendicular to the bit line, or between the capacitor of the memory cell connected to a bit line BL and the capacitor of the memory cell connected to a complementary bit line ZBL, it may be possible to write the ground voltage into the storage nodes of all the memory cells first, then to drive the word lines for the memory cells connected to bit lines BL or ZBL to the selected state, and then to apply the boosted potential through the bit line equalizing circuits. In this case, the boosted voltage is applied to both bit lines BL and ZBL, and therefore the boosted voltage is applied to a bit line to which the boosted voltage does not need to be applied, and thus there causes unnecessary power consumption. Furthermore, this case impedes the advantage of the static burn-in test that all the word lines are driven to the selected state at the same time to shorten the testing time period.

It may be possible to provide a burn-in equalizing transistor dedicated to the static burn-in test for each bit line, instead of utilizing the bit line equalizing circuit. With the dedicated transistors for the burn-in provided on the respective bit lines BL and ZBL, one transfers the boosted voltage and the other transfers the ground voltage so that the boosted voltage can be applied to one of bit lines BL and ZBL and the ground voltage can be applied to the other of the bit lines BL and ZBL. Thus, a voltage can be applied to a dielectric film of a memory cell capacitor and also voltage stress can be applied to an interlayer insulating film between the storage nodes of adjacent memory cells. However, providing such dedicated burn-in equalizing circuits on the respective bit lines increases the area occupied by the bit line peripheral circuits and requires interconnection for transferring the boosted voltage for the burn-in test, resulting in an increased interconnection layout area.

Furthermore, in the case where both thick film MOS transistors and thin film MOS transistors are provided in a mixed manner in the sense amplifier band, some isolation regions are required, as will be described later. The dual gate process requires etching away of the gate insulating film of thin film MOS transistor once in forming the thick film MOS transistor and the thin film MOS transistor. Further, the dual gate process requires the ensured margin for the accuracy of the etching mask alignment. Further, it becomes necessary to relax the steps due to thickness differences between the gate insulating films of MOS transistors, which requires separation regions for relaxing the steps between the regions in which thin film MOS transistor are formed and the regions in which thick film MOS transistor are formed. By placing the separating regions for relaxing the steps, it is possible to accurately form resist patterns without being affected by halation of exposure light and others in patterning and also to prevent over-etching due to reflection of irradiated ions. Consequently, because of the separation region provided taking into account such mask alignment and process margin, there may arise such a problem that the layout area of the circuit in the sense amplifier band is increased and accordingly the array area is increased.

SUMMARY OF THE INVENTION

It is an object of the present invention to provide a semiconductor memory device capable of accommodating a static burn-in test while suppressing increase in a layout area of a sense amplifier band.

It is another object of the present invention to provide a semiconductor memory device capable of suppressing increase in a layout area of a sense amplifier band without degrading an operation characteristic of a sense amplifier circuit.

A semiconductor memory device according to a first aspect of the present invention includes: a memory array including a plurality of memory cells, arranged in rows and columns, each including a capacitor for storing information; a plurality of sense amplifier circuits for amplifying and latching stored data in selected memory cells in the memory array, the sense amplifier circuits being placed in correspondence to the respective memory cell columns of the memory array and including first insulated gate type field effect transistors having a first gate insulating film thickness; and peripheral circuitry for performing at least an operation related to selection of a memory cell in the memory array, the peripheral circuitry being placed outside of the memory array and including second insulated gate type field effect transistors having a second gate insulating film thickness smaller than the first gate insulating film thickness.

A semiconductor memory device according to a second aspect of the present invention includes a plurality of memory blocks each including a plurality of memory cells arranged in rows and columns. The plurality of memory blocks are aligned in both directions of rows and columns. The memory blocks aligned in the row direction constitute a row block.

A semiconductor memory device according to the second aspect of the present invention further includes a plurality of pairs of bit lines placed in correspondence to the memory cell columns in each memory block and connected to the memory cells in the corresponding columns and a plurality of sense amplifier bands placed in correspondence to the row blocks such that the sense amplifier circuits are shared by adjacent row blocks. In the sense amplifier band, there are placed at least a plurality of sense amplifier circuits arranged in correspondence with the memory cell columns in the corresponding row block and sensing and amplifying, when activated, data in selected memory cells in a corresponding row block, and a plurality of bit line peripheral circuits each for performing a predetermined operation, the bit line peripheral circuits being arranged in correspondence to the bit lines in a corresponding memory block. The sense amplifier intra-band circuit including the sense amplifier circuits and bit line peripheral circuit arranged in the sense amplifier band includes, as the components, first insulated gate type field effect transistors having the same gate insulating film thickness.

A semiconductor memory device according to the second aspect of the present invention further includes an array peripheral circuitry arranged corresponding to the memory array for performing an operation related to selection of a memory cell in the memory array. The array peripheral circuitry is formed of second insulated gate type field effect transistors having a gate insulating film thickness smaller than that of the first insulated gate type field effect transistors.

By constituting the sense amplifier circuits by MOS transistors having a gate insulating film thicker than that of MOS transistors in the peripheral circuitry, the gate insulating films of the MOS transistors arranged in the sense amplifier circuits can be made the same, which eliminates the necessity for the separating regions for forming thick film MOS transistors and thin film MOS transistors to reduce the area occupied by the sense amplifier bands. Further, by forming the sense amplifier circuits by thick film MOS transistors, the boosted voltage for the static burn-in can be supplied to memory cells thorough the sense amplifier circuits, which eliminates the necessity of additional provision of a dedicated circuit for the static burn-in, further suppressing an increase in layout area of the sense amplifier bands.

Furthermore, by transferring the boosted voltage using the sense amplifier circuits in the static burn-in, the potentials of complimentary bit lines are at complimentary voltage levels, which enables acceleration of voltage stresses between the storage nodes and the cell plates of memory cell capacitors as well as acceleration of stresses across the interlayer insulating films between the storage nodes of adjacent memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
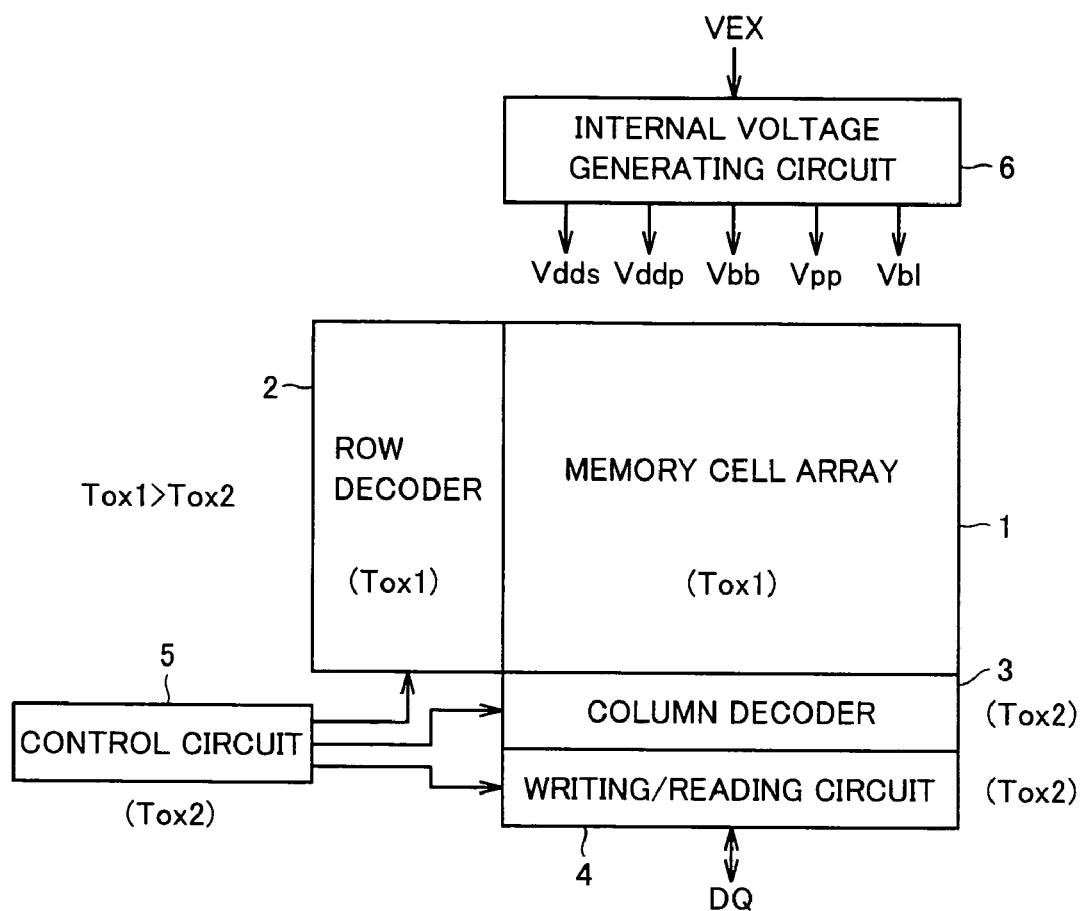
FIG. 1 is a diagram schematically showing the entire structure of a semiconductor memory device according to the present invention.

FIG. 1 is a diagram schematically showing the entire construction of a DRAM according to a first embodiment of the present invention. In FIG. 1, the DRAM according to the first embodiment of the present invention includes a memory cell array 1 including a plurality of memory cells arranged in rows and columns, a row decoder 2 for selecting a memory cell row in memory cell array 1, a column decoder 3 for generating a column selection signal for selecting a memory cell column in memory cell array 1, a writing/reading circuit 4 for performing writing/reading of data to a memory cell on a column selected by column decoder 3, a control circuit 5 for controlling a memory cell selecting operation and a data-writing/data-reading operation, and an internal voltage generating circuit 6 receiving an external power supply voltage VEX to generate internal voltages Vdds, Vddp, Vbb, Vpp and Vb1. Voltage Vdds is an array (sense) power supply voltage which determines the potential of the "H" (logical high) level of storage data. Voltage Vddp is a peripheral power supply voltage, which is used as an operation power supply voltage by control circuit 5 and others. Voltage Vpp is a boosted voltage which is higher than power supply voltage Vdds and is supplied to a word line in memory cell array 1. Voltage Vbb is a negative voltage and is used as a substrate bias voltage to memory cell array 1. Voltage Vb1 is an intermediate voltage which is half the array power supply voltage and is used as a precharge voltage to bit lines and as a cell plate voltage which is applied to electrodes of memory cell capacitors.

In memory cell array 1, DRAM cells are arranged and their access transistors each have a gate insulating film thickness Tox1. Bit line peripheral circuits, such as bit line equalize circuits and bit line isolation gates, and sense amplifier circuits, which are arranged in memory cell array 1, are all formed of MOS transistors having the gate insulating film thickness Tox1. In other words, in memory cell array 1, thick film MOS transistors are arranged, but no thin film MOS transistor is arranged.

In row decoder 2, similarly, thick film MOS transistors having the gate insulating film thickness Tox1 are arranged in a word line drive circuit section, in order to supply the high voltage Vpp to a selected word line in memory cell array 1.

Column decoder 3, writing/reading circuit 4 and control circuit 5 which are arranged outside memory cell array 1 are formed of thin film MOS transistors having a gate insulating film thickness Tox2 in order to achieve a high speed operation. Here, the following relation holds: Tox1>Tox2.

Internal voltage generating circuit 6 is preferably formed of thick film MOS transistors and generates an internal voltage at a desired voltage level through accurate analog operations.

By using thick film MOS transistors for the bit line peripheral circuits and the sense amplifier circuits in memory cell array 1, there is no need for separation regions required for arranging both thin film MOS transistors and thick film MOS transistors, thereby achieving a reduced array area. Further, since no thin film MOS transistor is present in memory cell array 1, it is possible to supply the boosted voltage to memory cell array using these circuits in the array in a static burn-in test. Therefore, there is no need to place a dedicated test circuit for static burn-in on each bit line, thereby achieving a reduced circuit layout area.

The DRAM shown in FIG. 1 can be any semiconductor memory device based on DRAM cells and may be used as a single DRAM or may be integrated with other processing device such as a logic on a single semiconductor substrate into a system LSI. Further, the DRAM shown in FIG. 1 may be an embedded DRAM integrated with a logic on a single semiconductor substrate.

Figure 2:
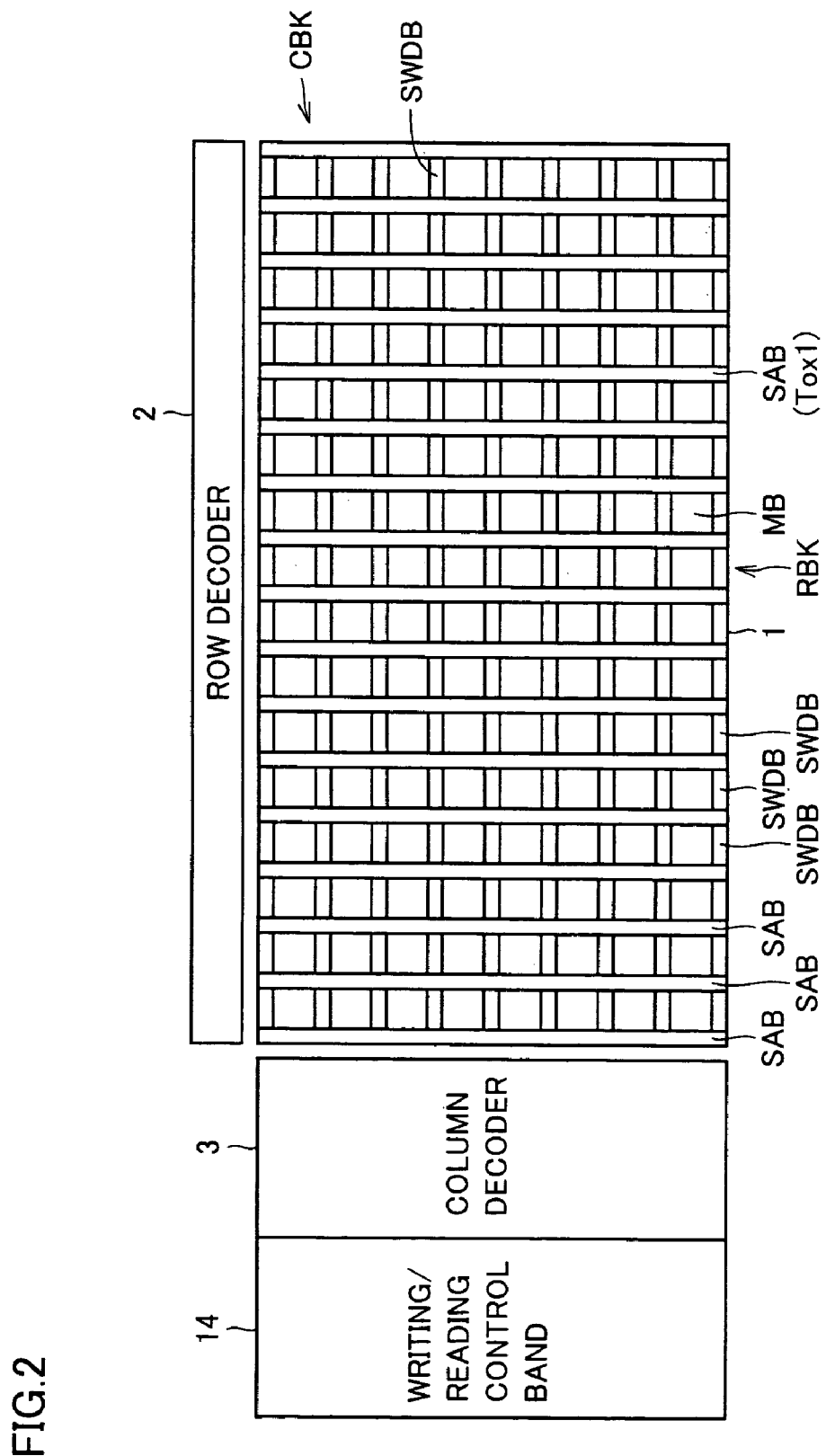
FIG. 2 is a diagram schematically showing the structure of the memory cell array shown in FIG. 1.

FIG. 2 is a diagram schematically showing the construction of memory cell array 1 shown in FIG. 1. In FIG. 2, memory cell array 1 is divided into a plurality of memory blocks MB by sense amplifier bands SAB extending in the direction of rows and sub word line driver bands SWDB extending in the direction of columns. The memory blocks MB aligned in the row direction constitute a memory row block RBK and the memory blocks MB aligned in the column direction constitute a memory column block CBK.

Each sense amplifier band SAB includes sense amplifier circuits shared between the adjacent row blocks RBK. The word lines have a hierarchical structure consisting of main word lines and sub word lines. In each memory block MB, sub word lines (not shown) are arranged corresponding to memory cell rows. To drive these sub word lines, sub word line drivers are arranged corresponding the sub word lines, in sub word line driver bands SWDB. The main word lines are arranged to be shared by the memory blocks in each row block and are driven to a selected state according to row selection signals (main word line driving signals) from row decoder 2. In each memory block MB, a plurality of sub word lines are arranged for one main word line.

Row decoder 2 and column decoder 3 are placed at the outside periphery of memory cell array 1. A writing/reading control band 14 is laid out adjacent to column decoder 3. In writing/reading control band 14, there are arranged writing/reading circuit 4 shown in FIG. 1, a control circuit for controlling the operations of a write driver and a preamplifier included in writing/reading circuit 4, and an input/output buffer for inputting and outputting external data.

In FIG. 2, thick film MOS transistors having the gate insulating film thickness Tox1 are arranged in sense amplifier bands SAB. In column decoder 3 and writing/reading control band 14, thin film MOS transistors having the film thickness Tox2 are arranged.

Figure 3:
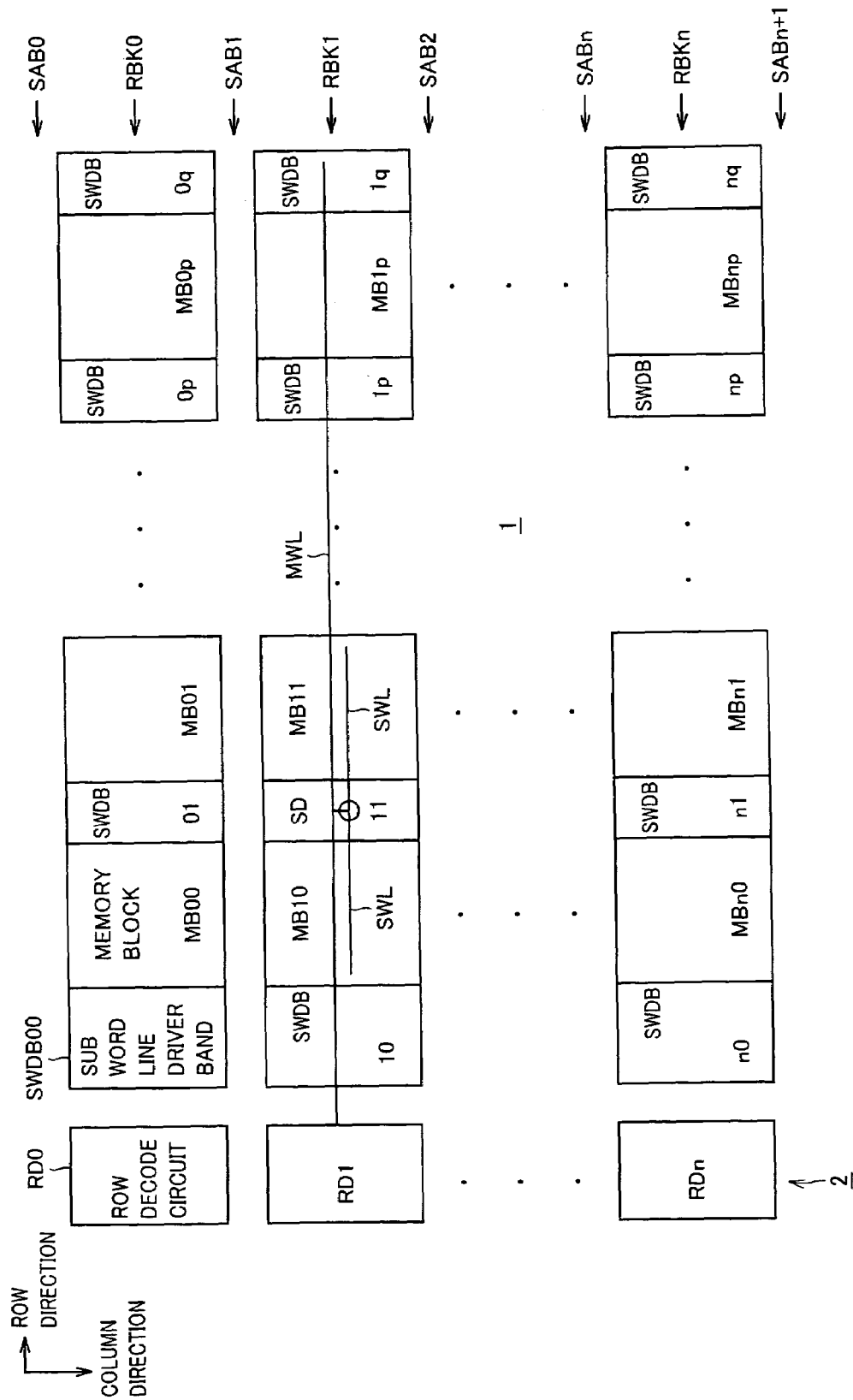
FIG. 3 is a diagram specifically showing the structure of the memory cell array shown in FIG. 2.

FIG. 3 is a diagram showing the construction of memory cell array 1 shown in FIG. 2, more specifically. Memory cell array 1 is divided into a plurality of memory row blocks RBK0 to RBKn. Each of memory row blocks RBK0 to RBKn includes a plurality of memory blocks MB aligned in the row direction. Specifically, memory row block MBKi includes memory blocks MBi0 to MBip aligned in the row direction, where i is any of integers of 0 to 9.

Row decode circuits RD0 to RDn for decoding row address signals are provided corresponding to memory row blocks RBK0 to RBKn. These row decode circuits RD0 to RDn correspond to row decoder 2 shown in FIG. 2 and the row decode circuit provided corresponding to a selected memory row block performs a decoding operation.

In memory row block RBKi (i=0 to n), a main word line MWL for transferring a row selection signal from row decode circuit RDi is arranged extending in the row direction to be shared by memory blocks MBi0 to MBip.

Memory blocks MBi0 to MBip each include sub word lines SWL arranged corresponding to the respective memory cell rows and connected to the memory cells on the corresponding rows. To memory blocks MBi0 to MBip, sub word line driver bands SWDBi0 to SWDBiq are provided. Sub word line drivers are alternately laid out at both sides of memory block MBij. As representatively shown in FIG. 3 for memory blocks MB10 and MB11, a sub word line driver drives sub word lines in the adjacent memory blocks to a selected state, in response to the signal potential on a corresponding main word line MWL. Sub word line drivers are formed of thick film MOS transistors having the gate insulating film thickness Tox2, in order to transfer high voltage Vpp to associated sub word lines SWL.

Sense amplifier bands SAB1 to SABn are arranged between any memory row blocks adjacent in the column direction, and sense amplifier bands SAB0 and SABn+1 are arranged outside memory column blocks RBK0 and RBKn, respectively. In sense amplifier bands SAB1 to SABn, there are provided sense amplifier band-internal circuits, such as bit line peripheral circuits and sense amplifier circuits, which are formed of thick film MOS transistors.

Figure 4:
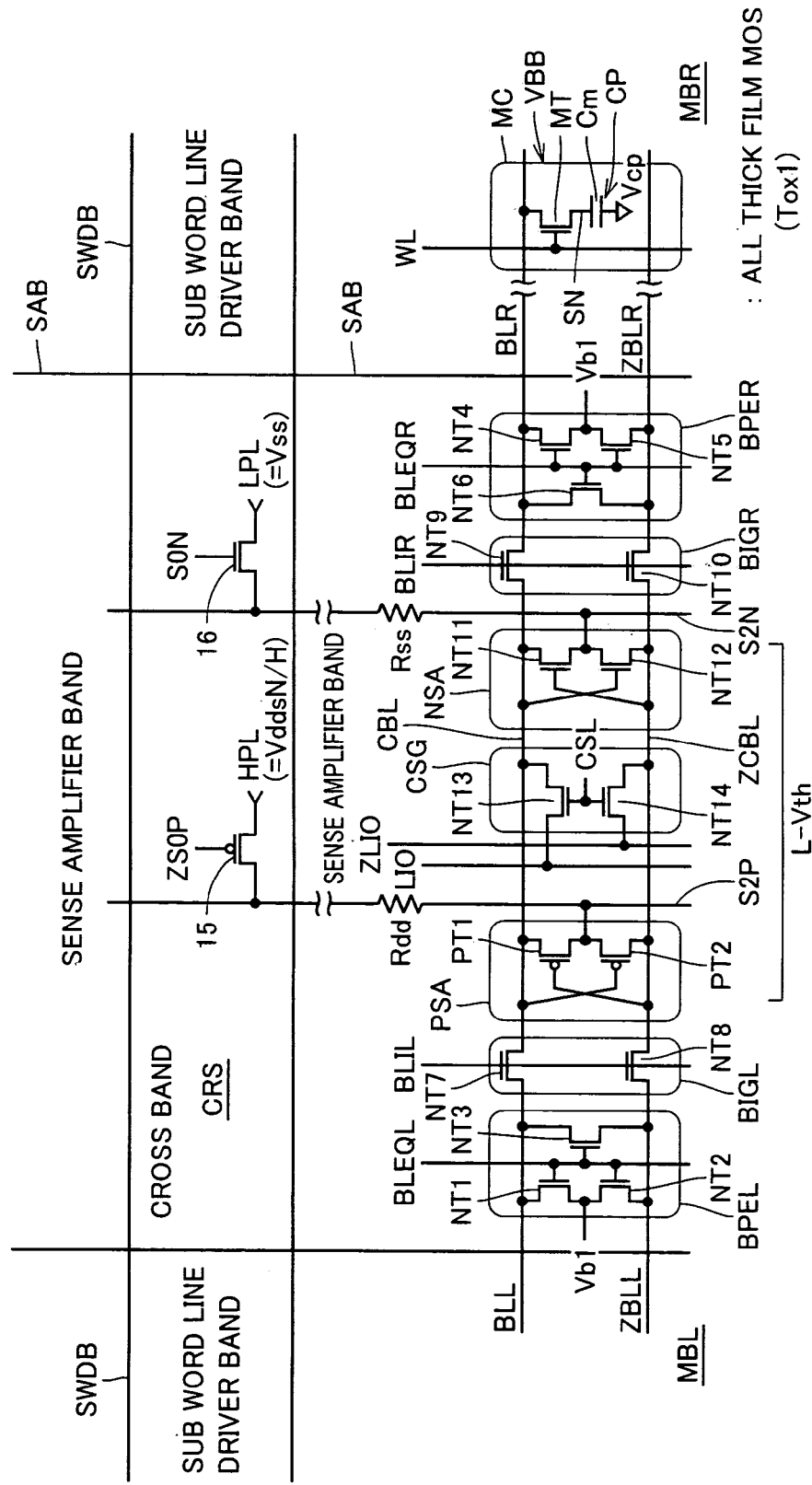
FIG. 4 is a diagram showing the structure of the circuits in the sense amplifier band shown in FIG. 3.

FIG. 4 is a diagram showing the construction of the sense amplifier circuits and the bit line peripheral circuits arranged in a sense amplifier band. In FIG. 4, there are representatively shown the configuration of the portions related to bit lines BLL, ZBLL and BLR, ZBLR included in memory blocks MBL and MBR, respectively.

In FIG. 4, bit lines BLL and ZBLL in memory block MBL are connected to common bit lines CBL, ZCBL through a bit line isolation gate BIGL, and bit lines BLR and ZBLR in memory block MBR are connected to common bit lines CBL and ZCBL through a bit line isolation gate BIGR. Memory blocks MBL and MBR are included in different row blocks.

Bit lines BLL and ZBLL are connected to memory cells aligned in a column in memory block MBL, and bit lines BLR and ZBLR are connected to memory cells aligned in a column in memory block MBR. In FIG. 4, there is representatively shown a memory cells MC connected to bit lines BLR in memory block MBR. Memory cell MC includes a memory cell capacitor Cm for storing information and an access transistor MT for connecting a storage node SN of memory cell capacitor Cm to bit line BLR according to a signal on word line WL (sub word line SWL). The substrate region of this memory cell MC is supplied with a negative voltage VBB as a substrate bias voltage. The cell plate CP of memory cell capacitor Cm is supplied with a cell plate voltage Vcp at a predetermined voltage level. This cell plate voltage Vcp corresponds to intermediate voltage Vb1 shown in FIG. 1. In order to depict that this intermediate voltage is applied to the cell plate of memory cell capacitor Cm, the reference character Vcp is used instead of the reference character Vb1.

Since high voltage Vpp is supplied to word line WL (sub word line SWL), access transistor MT in memory cell MC is comprised of a thick film MOS transistor having a large film thickness.

Bit line isolation gate BIGL includes N-channel MOS transistors NT7, NT8 which are made conductive according to a bit line isolation instruction signal BLIL and when made conductive, connect bit lines BLL and ZBLL to common bit lines CBL and ZCBL, respectively. Bit line isolation gate BIGR includes N-channel MOS transistors NT9, NT10 which are made conductive according to a bit line isolation instruction signal BLIR and when made conductive, connect bit lines BLR and ZBLR to common bit lines CBL and ZCBL, respectively. In sensing and restoring operations, it is required to drive bit lines BLL, ZBLL and BLR, ZBLR to the array power supply voltage Vdds level and thus bit line isolation instruction signal BLIL or BLIR for a selected memory row block is maintained at a high voltage level. Therefore, MOS transistors NT7 to NT10 are formed of thick film MOS transistors.

To bit lines BLL and ZBLL, there is provided a bit line equalizing circuit BPEL for transferring intermediate voltage Vb1 to bit lines BLL and ZBLL when a bit line equalizing instruction signal BLEQL is active. To bit lines BLR and ZBLR, there is provided a bit line equalizing circuit BPER which is activated in response to a bit line equalizing instruction signal BLEQR and when active, transfers intermediate voltage Vb1 to bit lines BLR and ZBLR. Intermediate voltage Vb1 corresponds to intermediate voltage Vb1 shown in FIG. 1. Here, the intermediate voltage is used for bit line equalization, and therefore the character Vb1 is used without change.

Bit equalizing circuit BPEL includes N-channel MOS transistors NT1, NT2 which transfer intermediate voltage Vb1 to bit lines BLL and ZBLL in response to bit line equalizing instruction signal BLEQL, and an N-channel MOS transistor NT3 which electrically short-circuits bit line BLL and ZBLL in response to bit line equalizing instruction signal BLEQL. Bit line equalizing circuit BPER includes an N-channel MOS transistors NT4, NT5 which transfer intermediate voltage Vb1 to bit lines BLR and ZBLR in response to bit line equalizing instruction signal BLEQR, and an N-channel MOS transistor NT6 which electrically short-circuits bit lines BLR and ZBLR in response to bit line equalizing specification signal BLEQR.

By providing bit line equalizing circuits BPEL, BPER respectively to the pair of bit lines BLL and ZBLL and to the pair of bit lines BLR and ZBLR, it is possible to perform fast precharging/equalizing of these bit lines BLL, ZBLL, BLR and ZBLR, and accordingly the so-called RAS precharging time tRP can be shortened to reduce the cycle time.

Bit line equalizing instruction signals BLEQL, BLEQR are set to a voltage level higher than array power supply voltage Vdds, in order to quickly transfer the intermediate voltage (bit line precharging voltage Vb1) to bit lines BLL, BLR, ZBLL and ZBLR. Therefore, MOS transistors NT1 to NT3 and NT4 to NT6 in these bit line equalizing circuits BPEL and BPER are formed of thick film MOS transistors.

To common bit lines CBL and ZCBL, there are provided a P-channel sense amplifier PSA constituted by cross-connected P-channel MOS transistors PT1, PT2 and an N-sense amplifier NSA constituted by cross-coupled N-channel MOS transistors NT1, NT12. These sense amplifiers PSA, NSA in combination constitute the sense amplifier circuit for performing sensing and amplification of memory cell data.

P-sense amplifier PSA is activated when the voltage of a P-sense drive signal line S2P reaches array power supply voltage Vdds and drives a higher potential common bit line of common bit lines CBL, ZCBL to the array power supply voltage level. N-sense amplifier NSA is activated when a signal on an N-sense drive signal line S2N reaches the ground voltage level and drives a lower potential common bit line of common bit lines CBL, ZCBL to the ground voltage level.

MOS transistors PT1, PT2 in P-sense amplifier PSA are formed of thick film MOS transistors and MOS transistors NT11, NT12 in N-sense amplifier NSA are also formed of thick film MOS transistors. Since these sense amplifiers PSA and NSA are required to perform sensing operations at high speed with a sufficient margin, the absolute values of threshold voltages are set to sufficiently low voltage levels and MOS transistors PT1, PT2 and NT11, NT12 are formed of low threshold voltage (L-Vth) MOS transistors. Here, an L-Vth MOS transistor refers to a MOS transistor having a threshold voltage small in absolute value. As a method for reducing the threshold voltage, a method which optimizes the condition of ion implantation into the channel region of a thick film MOS transistor to reduce the threshold voltage, is utilized as an example.

In order to drive P-sense drive signal line S2P, there is provided a P-sense drive transistor 15 formed of a P-channel MOS transistor which is made conductive in response to a P-sense activation signal ZS0P being active and transfers the voltage of a high-side sense power supply main line HPL to P-sense drive signal line S2P. In order to drive N-sense drive signal line S2N, there is provided an N-sense drive transistor 16 formed of a N-channel MOS transistor and made conductive in response to an N-sense activation signal S0P being activate, to connect a low-side sense power supply main line LPL to N-sense drive signal line S2N. In a normal operation mode, high-side sense power supply main line HPL is supplied with array power supply voltage VddsN, while in a static burn-in mode, high-side sense power supply main line HPL is supplied with a boosted voltage VddsH higher than array power supply voltage VddsN. Low-side sense power supply main line LPL is usually supplied with ground voltage Vss. The sense drive transistors 15, 16 are arranged in a cross band CRS corresponding to an intersection region of sub word line driver band SWDB and sense amplifier band SAB. These sense drive transistors 15, 16 are formed of thick film MOS transistors, and the absolute values of the threshold voltages of these sense drive transistors 15, 16 are set to a small value.

There exist parasitic resistances Rdd, Rss on P-sense drive signal line S2P and N-sense drive signal line S2N. By arranging these sense drive transistors 15, 16 in cross band CRS, sense drive transistors 15, 16 are arranged for a predetermined number of P-sense amplifiers PSA and a predetermined number of N-sense amplifiers NSA to suppress the influence of parasitic resistances Rdd and Rss on P-sense drive signal line S2P and N-sense drive signal line S2N, and the sense power supply voltages can be supplied stably to P-sense amplifiers PSA and N-sense amplifiers NSA without causing a voltage distribution to achieve a stabilized sensing operation.

To common bit lines CBL and ZCBL, there is provided a column selection gate CSG for connecting common bit lines CBL and ZCBL to local data lines LIO and ZLIO according to a column selection signal CSL from the column decoder shown in FIG. 2. This column selection gate CSG is formed of N-channel MOS transistors NT13, NT14 which receive column selection signal CSL at their gates. In order to enable quick transfer of the potentials at common bit lines CBL and ZCBL to local data lines LIO and ZLIO in a column selecting operation, MOS transistors NT13, NT14 in column selection gate CSG are formed of low threshold voltage (L-Vth) thick film MOS transistors.

Local data lines LIO and ZLIO are connected to global data lines arranged in a region outside memory cell array 1 through a block selection switch (not shown). However, local data lines LIO and ZLIO may be connected to the global data lines extending in the column direction on memory cell array 1.

As shown in FIG. 4, by constructing all the transistors arranged in sense amplifier band SAB by the thick film MOS transistors, there is no need for separation areas required for laying out both thin film MOS transistors and thick film MOS transistors, to reduce the layout area of the sense amplifier band.

Furthermore, sense amplifier PSA and NSA are formed of thick film MOS transistors, which ensures the breakdown characteristics of MOS transistors PT1, PT2 and NT11, NT12 even if boosted voltage VddsH is supplied to P-sense drive signal line S2P in the static burn-in mode. This enables reliable static burn-in test.

Further, by constructing the N-channel MOS transistors in the circuits within sense amplifier band SAB and access transistors NT of memory cells MC by transistors having the same gate insulating film, these bit line peripheral circuits and the N-sense amplifier can be formed through the same fabricating process steps except the ion implantation process for threshold voltage adjustment.

Further, in the static burn-in test, the voltage levels of common bit lines CBL, ZCBL can be set to complimentary voltage levels by P-sense amplifier PSA and N-sense amplifier NSA and therefore adjacent memory cells can have their storage nodes SN at different voltage levels. Thus, voltage stress can be reliably accelerated for the interlayer insulating film between the storage nodes of adjacent memory cells, as compared with the conventional case of using bit line equalizing circuits.

Furthermore, there is no necessity to place dedicated test circuit for the static burn-in to each bit line, resulting in a reduced layout area of the bit line peripheral circuitry.

Further, the organization of memory cells MC is arbitrary. One bit of data may be stored in a single memory cell or in two memory cells. The semiconductor memory device according to the present invention can be any memory device, as far as DRAM cells MC are utilized as storage elements.

As described above, according to the first embodiment of the present invention, the bit line peripheral circuits and the sense amplifier circuit laid in the sense amplifier band are all formed of thick film MOS transistors and therefore there is no need for separation areas for separating thin film MOS transistors and thick film MOS transistors, achieving reduction of the area of the sense amplifier band. Further, since the sense amplifier circuit is formed of thick film MOS transistors, the sense amplifier circuit can be utilized to apply a boosted voltage to bit lines and memory cells in the static burn-in mode. This ensures accurate static burn-in test without degrading the breakdown characteristics of the transistors in the sense amplifier circuits.

Second Embodiment

Figure 5:
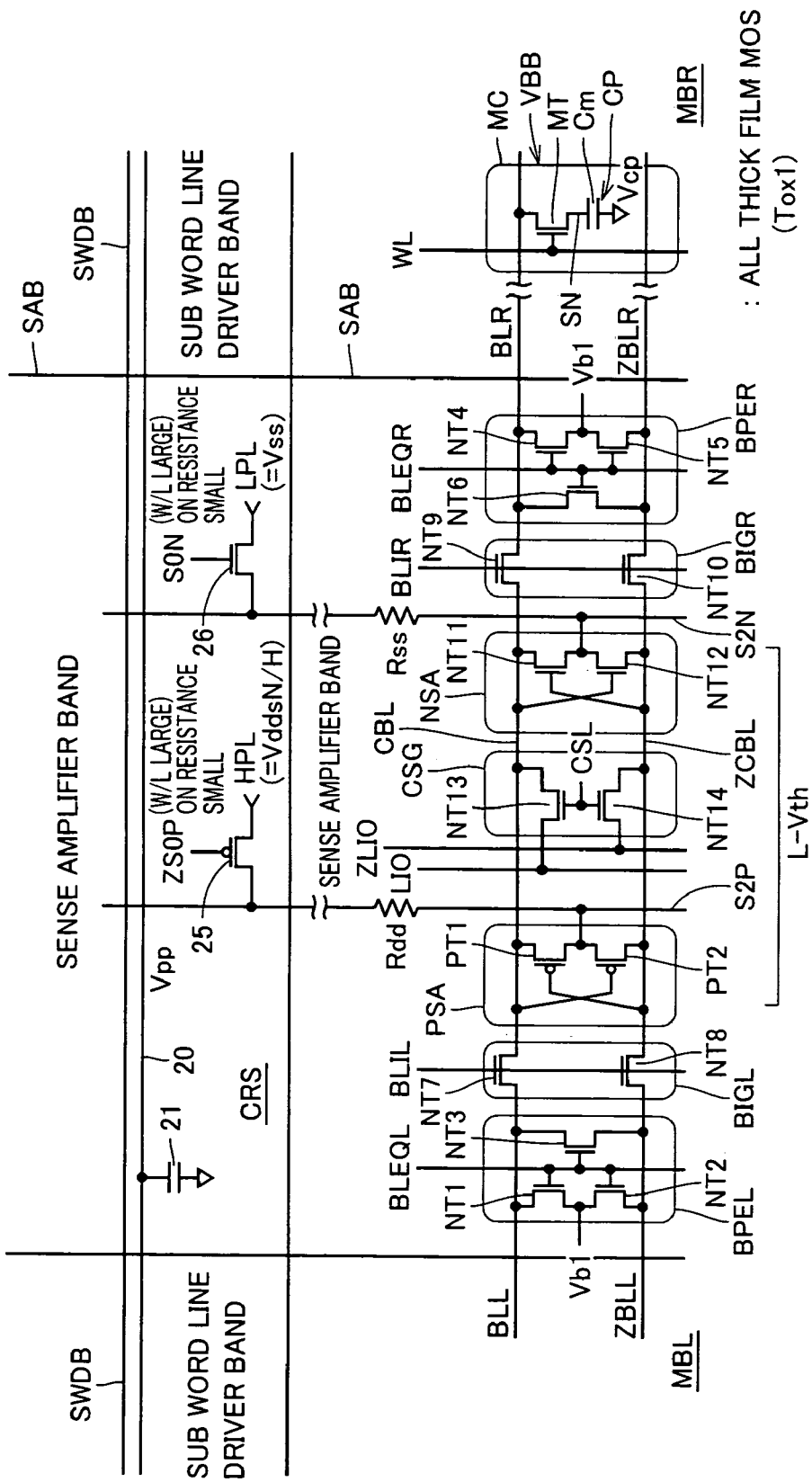
FIG. 5 is a diagram schematically showing the arrangement of the circuits in the sense amplifier band according to the second embodiment of the present invention.

FIG. 5 is a diagram schematically showing the structure of a main portion of a DRAM according to the second embodiment of the present invention. In the construction shown in FIG. 5, there are arranged, in cross band CRS, a P-sense drive transistor 25 having a sufficiently small on-resistance and an N-sense drive transistor 26 having a sufficiently small on-resistance. These sense drive transistors 25, 26 each have a sufficiently large ratio of channel width to channel length W/L and equivalently a small on-resistance.

The other construction shown in FIG. 5 is the same as that shown in FIG. 4 and corresponding components are identified by the same reference characters and the detailed description thereof will not be repeated.

In cross band CRS, there is placed a high voltage line 20 for transferring high voltage Vpp to sub word line drivers provided in sub word line driver bands SWDB. A decouple capacitance 21 for stabilizing high voltage Vpp is connected to high voltage line 20. Sense drive transistors 25, 26 of sufficiently large sizes are laid out utilizing a part of the region for laying out decouple capacitance 21 in cross band CRS. Thus, parasitic resistance components in P-sense drive signal lines S2P and S2N are reduced to suppress voltage drops in sense power supply voltages VddsN and Vss, thereby stabilizing the operation of the sense amplifiers.

Further, in cross band CRS, decouple capacitance 21 is placed and only the region for placing this decouple capacitance is utilized, thereby sufficiently suppressing increases in the layout area of sub word line driver bands SWDB and cross bands CRS.

Figure 6:
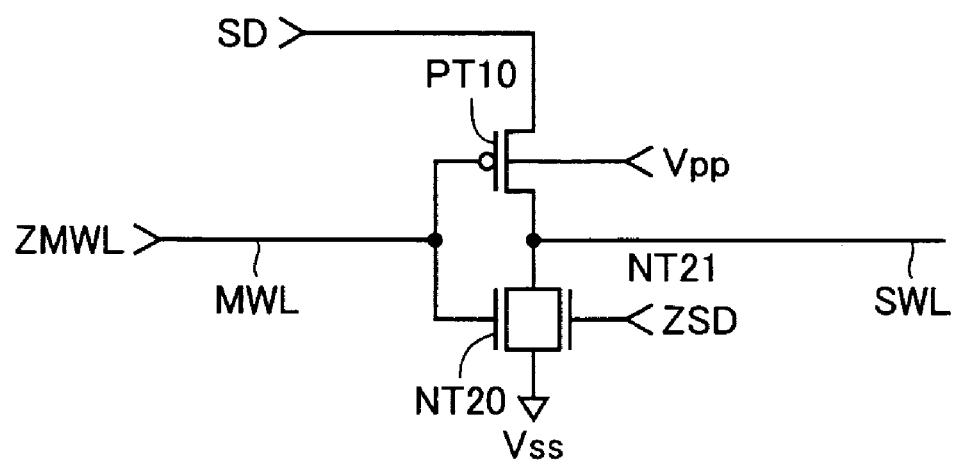
FIG. 6 is a diagram exemplifying a structure of the word line driver arranged in a sub word line driver band.

FIG. 6 is a diagram showing an exemplary configuration of the sub word line driver arranged in sub word line driver band SWDB shown in FIG. 5. In FIG. 6, the sub word line driver includes a P-channel MO S transistor PT10 for selectively transferring a sub decode signal SD to sub word line SWL according to a main word line drive signal ZMWL on main word line MWL. The sub word line driver further includes an N-channel MOS transistor NT20 for connecting sub word line SWL to low-side power supply voltage Vss according to main word line drive signal ZMWL, and an N-channel MOS transistor NT21 for connecting sub word line SWL to low-side power supply voltage Vss according to a complementary sub decode signal ZSD. The back gate of P-channel MOS transistor PT10 is supplied with high voltage Vpp. Sub decode signal SD is varied between high voltage Vpp and low-side power supply voltage Vss. Complementary sub decode signal ZSD is varied between low-side power supply voltage Vss and high-side power supply voltage Vdds. Low-side power supply voltage Vss is generally the ground voltage, but may be a negative voltage.

As shown in FIG. 6, in the sub word line driver, the back gate of P-channel MOS transistor PT10 is supplied with high voltage Vpp. This high voltage Vpp is supplied through high voltage line 20 shown in FIG. 5 and is stabilized by decouple capacitance 21 shown in FIG. 5.

In operation of the sub word line driver, when main word line drive signal ZMWL is at the low-side power supply voltage Vss level, MOS transistor NT20 is in the off state. When sub decode signal SD is at the high voltage Vpp level, MOS transistor PT10 is in the on state, and thus high voltage Vpp is transferred to sub word line SWL. When sub decode signal SD is at the low-side power supply voltage Vss level, the MOS transistor PT10 is in the off state. At this time, complementary sub decode signal ZSD is at an H level and thus MOS transistor NT21 is in the on state to maintain sub word line SWL at the low-side power supply voltage Vss level.

By laying out sense drive transistors 25, 26 for driving P-sense drive signal line S2P and N-sense drive signal line S2N through utilization of the region for forming decouple capacitance 21 for stabilizing high voltage Vpp that is supplied to sub word line driver band SWDB, it is possible to stably supply the operation power supply voltage to sense amplifier circuits to perform stable, high-speed sensing operation, without increasing the areas of the sense amplifier band and the sub word line driver band.

Since the sub word line driver is required to drive high voltage Vpp, MOS transistors PT10, NP20 and NT21 which are the components of the sub word line driver are formed of thick film MOS transistors.

Modification

Figure 7:
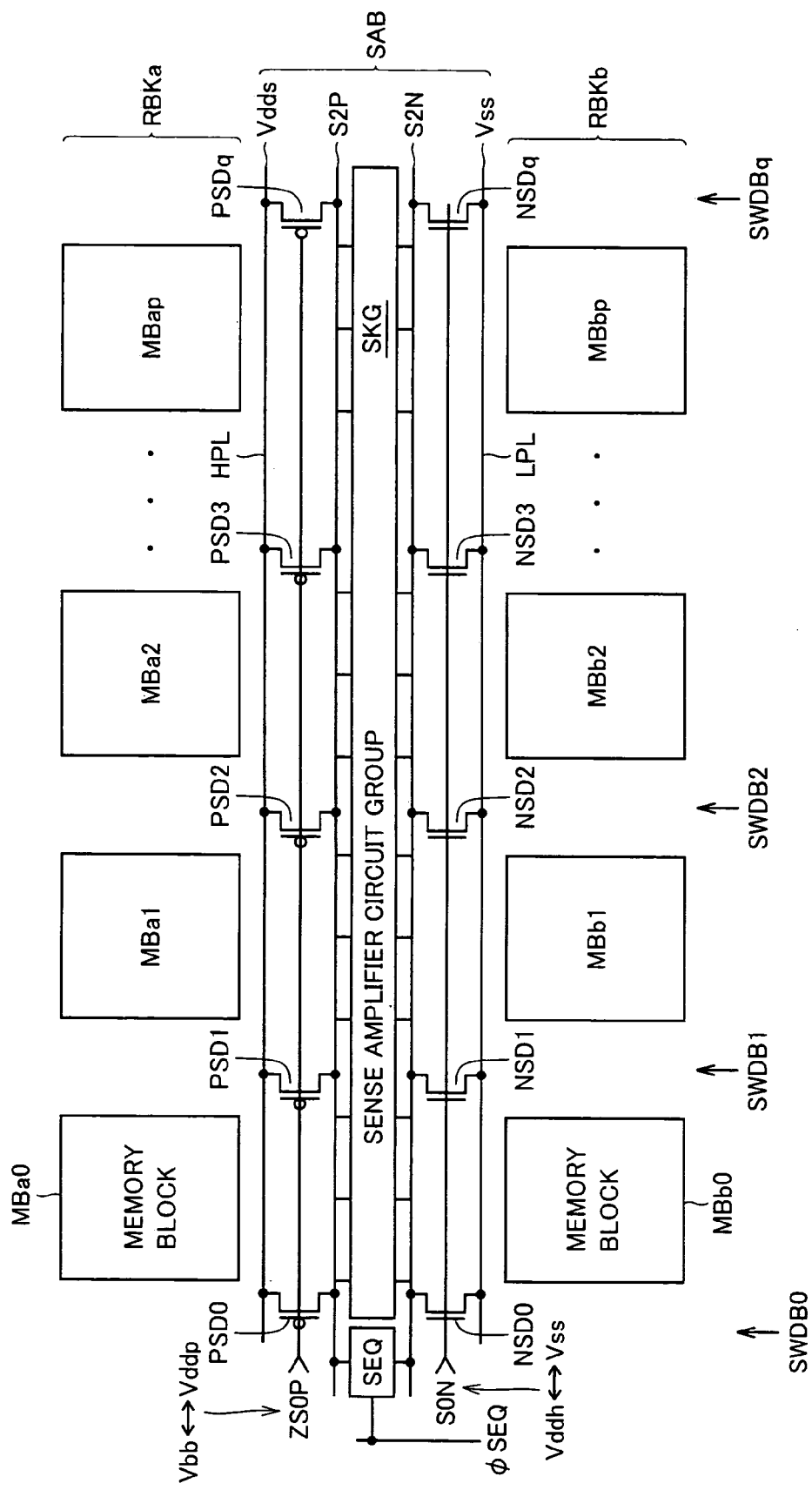
FIG. 7 is a diagram schematically showing the structure of a first modification of the second embodiment of the present invention.

FIG. 7 is a diagram schematically showing the construction of the modification of the second embodiment of the present invention. In FIG. 7, memory row blocks RBKa and RBKb share sense amplifier band SAB. Memory row block RBKa includes memory blocks MBa0 to MBap and memory row block RBKb includes memory blocks MBb0 to MBbp. Corresponding to these memory blocks MBa0, MBb0, to MBap, and MBbp, sub word line driver bands SWDB0 to SWDBq are provided.

In sense amplifier band SAB, there are provided a sense amplifier circuit group SKG and sense drive signal lines S2P, S2N extending in the row direction in correspondence to sense amplifier circuit group SKG. In the cross bands corresponding to respective sub word line driver bands SWDB0 to SWDBq, pairs of sense drive transistors PSD0, NSD0 to PSDq, NSDq are respectively provided.

Sense drive signal lines S2P and S2N are precharged to the intermediate voltage Vb1 level by a sense equalizing circuit SEQ. This sense equalizing circuit SEQ receives a sense equalizing instruction signal φSEQ, which is activated at the same timing as bit line equalizing instruction signal BLEQ.

Sense drive transistors PSD0 to PSDq receive a sense activation signal ZS0P at their gates and sense drive transistors NSD0 to NSDq receive a sense activation signal S0N at their gates. Sense activation signal ZS0P is changed between negative voltage Vbb and peripheral power supply voltage Vddp, and sense activation signal S0N is changed between a voltage Vddh higher than peripheral power supply voltage Vddp and low-side power supply voltage (ground voltage) Vss. In parallel with sense drive signal lines S2P and S2N, there are arranged a high-side sense power supply main line HPL and a low-side sense power supply main line LPL, which transfer sense power supply voltage Vdds and low-side power supply voltage Vss, respectively.

In the configuration shown in FIG. 7, sense drive transistors PSD0 to PSDq, when conductive, are supplied with negative voltage Vbb at their gates and their conductance becomes greater than in the state in which they are supplied with the ground voltage. Similarly, when sense drive transistors NSD0 to NSDq are conductive, sense activation signal S0N is set to the voltage Vddh level higher than peripheral power supply voltage Vddp and thus their conductance becomes greater. Consequently, sense drive signal line S2P is connected to high-side sense power supply main line HPL through a low resistance and sense drive signal line S2N is connected to low-side sense power supply main line LPL through a low resistance. Even if there exist interconnection line resistances of sense drive signal lines S2P and S2N, the on-resistance components of sense drive transistors can be reduced to supply the sense power supply voltages to the sense amplifiers included in sense amplifier circuit group SKG to achieve stabilized sensing operation.

Figure 8:
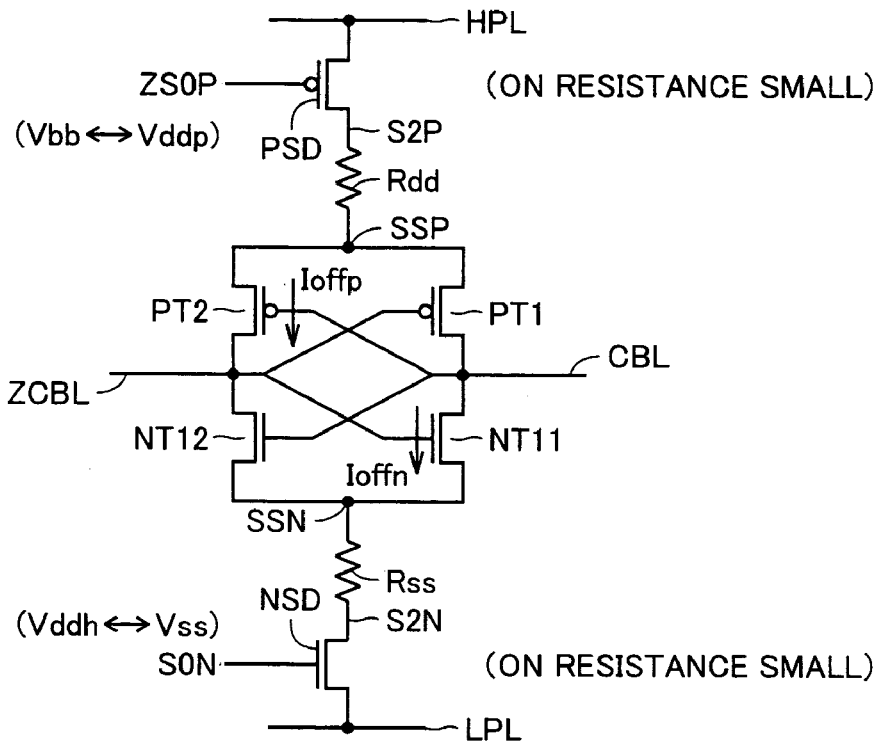
FIG. 8 is a diagram schematically showing the structure of the portion related to the sense amplifier according to the second embodiment of the present invention.

FIG. 8 is a diagram schematically showing the construction of a portion related to a single sense amplifier circuit. The sense amplifier includes cross-connected P-channel MOS transistors PT1 and cross-connected PT2 and N-channel MOS transistors NT11 and NT12 (refer to FIG. 5). A common source node SSP of MOS transistors PT1 and PT2 is connected to a sense drive transistor PSD through sense drive signal line S2P. There exists a parasitic resistance Rdd on sense drive signal line S2P. Sense drive transistor PSD connects high-side sense power supply main line HPL to sense drive signal line S2P according to sense activation signal ZS0P being active.

On the other hand, a common source node SSN of N-channel MOS transistors NT11 and NT12 is connected to a sense drive transistor NSD through sense drive signal line S2N. This sense drive transistor NSD connects sense drive signal line S2N to low-side sense power supply main line LPL according to sense activation signal ZON.

MOS transistors PT1, PT2, NT11 and NT12 are thick film transistors. The absolute values of the threshold voltages of these MOS transistors PT1, PT2, NT11 and NT12 are lessened by impurity implantation into their channel regions to increase the minority-carrier concentration ions in the channel regions in the thick film MOS transistors. Therefore, when a low threshold voltage (L-Vth) MOS transistor is formed by impurity implantation, the depletion layer is easy to be broad to form an inversion layer. Therefore, the potential barrier at the channel region surface of a thick film MOS transistor in the off state is lower than that of a thin film MOS transistor in the off state. Therefore, a leakage current-(in the case of NMOS transistors, a current flowing from the drain to the source; an off leakage current) may occur in the off state.

As shown in FIG. 8, when the sense amplifier circuit operates and common bit line CBL, for example, is driven to the high-side power supply voltage level, MOS transistor PT2 and MOS transistor NT11 are in the off state, while MOS transistors PT1 and NT12 are in the on state. If there is a large off current, a current flows from high-side power supply main line BPL to low-side power supply main line LPL through MOS transistors PT2 and NT12, and similarly a current flows from high-side power supply main line HPL to low-side power supply main line LPL through MOS transistors PT1 and NT1. Therefore, when thick film MOS transistors are employed and the impurity implantation approach is used for lessening the absolute values of the threshold voltages, such a condition is placed that the off current should be reduced. In this case, as compared with the case of employing thin film MOS transistors, it becomes impossible to sufficiently lessen the absolute values of the threshold voltages, which may prevent the operation margin of the sense amplifier from being sufficiently large.

However, by increasing the amplitudes of sense activation signals ZS0P and S0N to increase the conductance of sense drive transistors PSD and NSD in the conductive state for increasing the driving power, parasitic resistances Rdd and Rss in connection with common source nodes SSP and SSN can be equivalently reduced. This can alleviate the requirement for reducing the threshold voltages of the thick MOS transistors constituting the sense amplifier circuit, which achieves both an improved sense amplifier operation margin and a reduced off leakage current in the sense amplifier active state.

Figure 9:
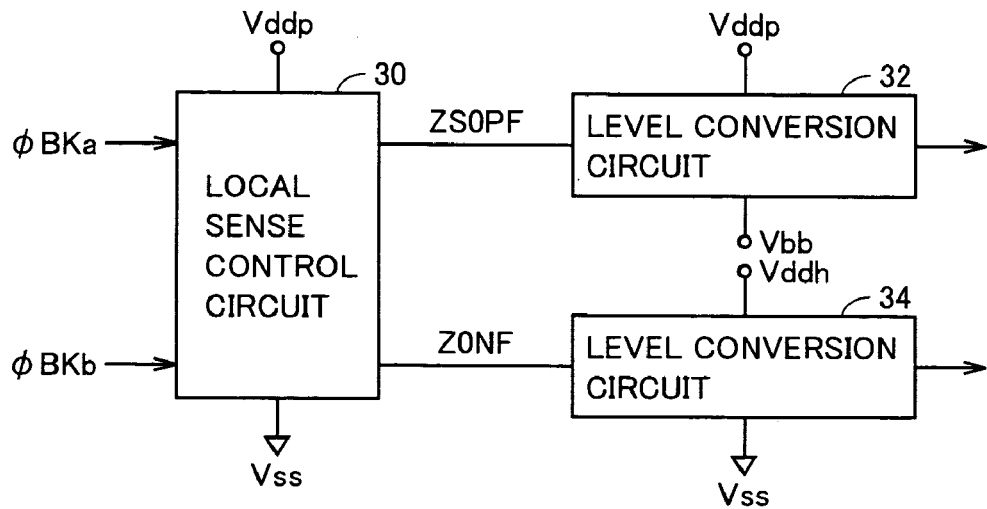
FIG. 9 is a diagram schematically showing an exemplary structure of the portion for generating the sense amplifier activation signal shown in FIG. 7.

FIG. 9 is a diagram showing an exemplary construction of the portion which generates the sense activation signals according to the modification of the second embodiment of the present invention. In FIG. 9, the sense activation signal generating portion is provided in correspondence to the sense amplifier band, and includes a local sense control circuit 30 which activates sense activation fast signals ZS0PF and S0NF when one of row block designation signals φBKa and φBKb is activated, a level conversion circuit 32 which converts the level of sense activation fast signal ZS0PF from local sense control circuit 30 to generate sense activation signal ZS0P, and a level conversion circuit 34 which converts the level of sense activation first signal S0PF from local sense control circuit 30 to generate sense activation signal S0P.

Local sense control circuit 30 operates with peripheral power supply voltage Vddp and low-side power supply voltage (ground voltage) Vss being the operation power supply voltages. Level conversion circuit 32 operates with peripheral power supply voltage Vddp and negative voltage Vbb being the operation power supply voltages and generates sense activation signal ZS0P at the negative voltage Vbb level when sense activation fast signal ZS0PF is active. Level conversion circuit 34 operates with high-side power supply voltage Vddh and low-side power supply voltage Vss being the operation power supply voltage and activates sense activation signal S0N by converting the high level of sense activation first signal S0NF into a signal at the voltage Vddh level.

Row block specification signal φBKa specifies a memory row block RBKa and row block specification signal φBKb specifies a memory row block RBKb shown in FIG. 7. Therefore, when one of memory row blocks RBKa and RBKb which share sense amplifier band SAB is specified, sense activation signals ZS0P and S0N are activated. It is sufficient that the configuration of local sense control circuit 30 is determined according to the internal structure of this semiconductor memory device. According to an internal array activation signal ACT, local sense control circuit 30 activates sense activation fast signals ZS0PF and S0NF at a predetermined timing when row block specification signal φBKa or φBKb is activated. Alternatively, local sense control circuit 30 may be configured to receive a main sense activation signal and activate or inactivate sense activation fast signals ZS0PF and S0NF at the timing of this main sense control signal.

By using level conversion circuits 32, 34, sense activation signal ZS0P can be easily set to the negative voltage Vbb level when made active, and also sense activation signal S0N can be easily set to the voltage Vddh level higher than the peripheral voltage Vddh level when made active.

For the internal structures of level conversion circuits 32, 34, conventional latch type level conversion circuits may be employed.

As described above, according to the second embodiment of the present invention, the sense drive transistors for driving the sense drive signal lines are arranged in the cross bands at the intersections of the sub word line drive bands and the sense amplifier bands and the on-resistances of the sense drive transistors are made small. This can reduce parasitic resistance in association with the sources of the thick film MOS transistors in the sense amplifier circuit, and therefore may alleviate the requirement for reduction of the threshold voltages of the thick film MOS transistors which are components of the sense amplifier. Thus, both a sense amplifier operation margin and reduction of the off currents when the sense amplifier can be balanced.

Third Embodiment

Figure 10:
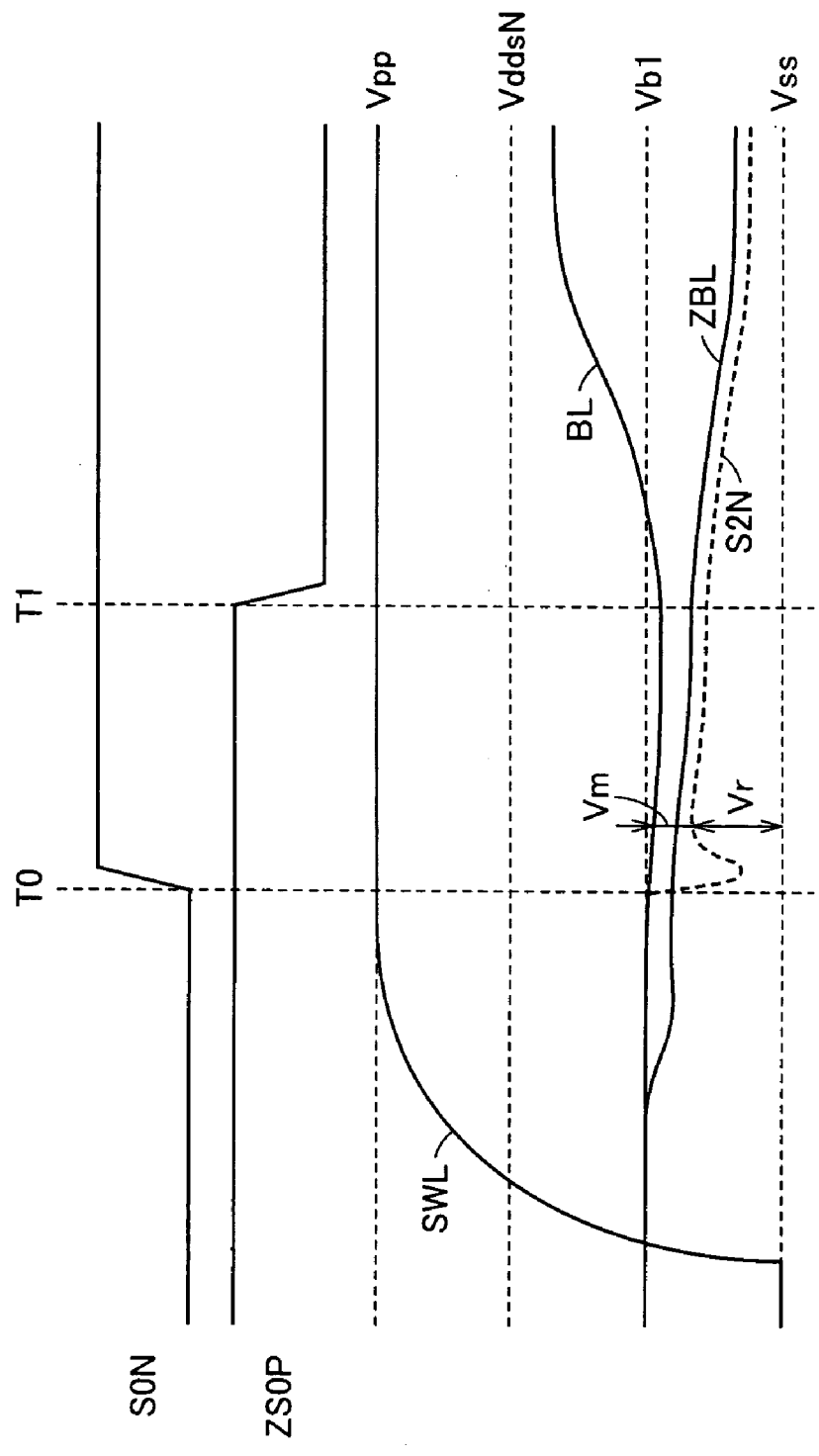
FIG. 10 is a diagram showing the signal waveforms of a conventional sensing operation.

FIG. 10 is a diagram showing exemplary signal waveforms of the sense amplifier band and a bit line in reading of memory cell data. FIG. 10 represents as an example signal waveforms in the case where L level data is read out on a bit line ZBL.

In the standby state, bit lines BL and ZBL are precharged and equalized at the intermediate voltage Vb1 level. When an active cycle is started and then a row selecting operation is performed, a word line (sub word line) SWL is driven to the selected state according to an address signal and the voltage level of sub word line SWL rises. Finally, the voltage level of sub word line SWL rises to the high voltage Vpp level. When the voltage level of sub word line SWL has risen and the access transistors of memory cells is conductive, the L level data is read out on bit line ZBL and the voltage level of bit line ZBL lowers.

At the time T0, sense activation signal S0N is activated and sense drive signal line S2N is driven toward the ground voltage level by the sense drive transistor. At this time, since sense drive signal line S2N drives a plurality of N-sense amplifiers, the voltage level of sense drive signal line S2N drops once and then rises due to discharge currents from bit lines ZBL. Now, the voltage level of bit line BL is represented by VBL(t), the threshold voltage of thick film N-channel MOS transistors is represented by VthN, the total current value flowing into sense drive signal line S2N through the thick film N-channel MO S transistors in the N-sense amplifiers is represented by IssN(t) and the on-resistance of the sense drive transistor (NSD, 16) is represented by Ron. Here, t refers to the time which has elapsed since the activation of the sense amplifiers.

In order to discharge electric charges on the bit line smoothly without causing the thick film N-channel MOS transistors in the N-sense amplifiers to turn off after the activation of sense activation signal S0N at the time T0, the following equation must hold over all the time region.

$$VBL(t) > VthN + IssN(t)*(Rss + Ron) + Vss \quad (1)$$

Here, the following definition is further made.

$$Vr(t) = IssN(t)*(Rss + Ron) + Vss$$

$$Vm(t) = VBL(t) - Vr(t)$$

Vr(t) in the above equation indicates the voltage rise level of sense drive signal line S2N, and Vm(t) indicates the gate-source voltage difference Vgs of the N-channel MOS transistor in the N-sense amplifier for driving a lower-potential bit line to the L level. Therefore, the above equation (1) requires that the following relation holds after the activation of the sense amplifiers, or that the gate-source voltage difference Vgs of the L-level discharging MOS transistor in the N sense amplifier be always higher than the threshold voltage.

$$Vm(t) > VthN \quad (2)$$

In the signal waveforms shown in FIG. 10, after a certain time has elapsed since the activation of the sense amplifiers, the potential of sense drive signal line S2N rises most, and thus the above relation (2) does not hold. In this case, the N-sense amplifiers stop the discharging operation and from then on, as the voltage level of sense drive signal line S2N is lowered by the driving power of the N-sense drive transistor, the L-level driving MOS transistor in the N-sense amplifier is brought into an weakly on-state and discharges the electric charges on bit line ZBL. At this time, the potential of bit line BL is also drops due to the coupling between bit lines BL and ZBL. Accordingly, until P-sense activation signal ZS0P is activated at time T1, the potential difference between bit lines BL and ZBL is small. Further, if the potential of sense drive signal line S2N decreases slowly, then the potential of complementary bit line ZBL also decreases slowly and therefore the absolute value of the potential difference between the gate and source of PMOS transistor in the P-sense amplifier is small. Consequently, the potential of bit line BL is raised slowly and it takes a long time to raise the potential of bit line BL to the voltage level of array power supply voltage Vdds. This delays the column access.

Such a situation occurs in the following conditions.

Threshold voltage VthN is not set to a sufficiently low value.

The maximum value of Vr(t), or the rise of the potential at sense drive signal line S2N, is too large.

In the first embodiment, threshold voltage VthN is set to a sufficiently low level, and in the second embodiment the on-resistance of sense drive transistor is reduced to reduce the rise Vr(t) of the potential at sense drive signal line S2N and ensure an operation margin of the sense amplifiers.

In the waveforms shown in FIG. 10, L level data is read out onto bit line ZBL. However, even when H level data is read out onto bit line ZBL, the same problem occurs since bit line BL at the intermediate voltage level is connected to sense drive signal line S2N and has the electric charges thereon discharged.

Further, if the on-resistance of P-sense drive transistors for driving the P-sense amplifiers is large, similarly, the potential at P-sense drive signal line S2P rises from intermediate voltage Vb1 first, once drops by supplying electric discharges to the bit line, and then the voltage level increases slowly. Therefore, for P-sense amplifiers, similarly, by setting the on-resistance of the P-sense drive transistors to a sufficiently low value, or by making the absolute value of the threshold voltage of the MOS transistors in the P-sense amplifiers sufficiently small, the voltage level of the higher-potential bit line can be quickly raised.

Figure 11:
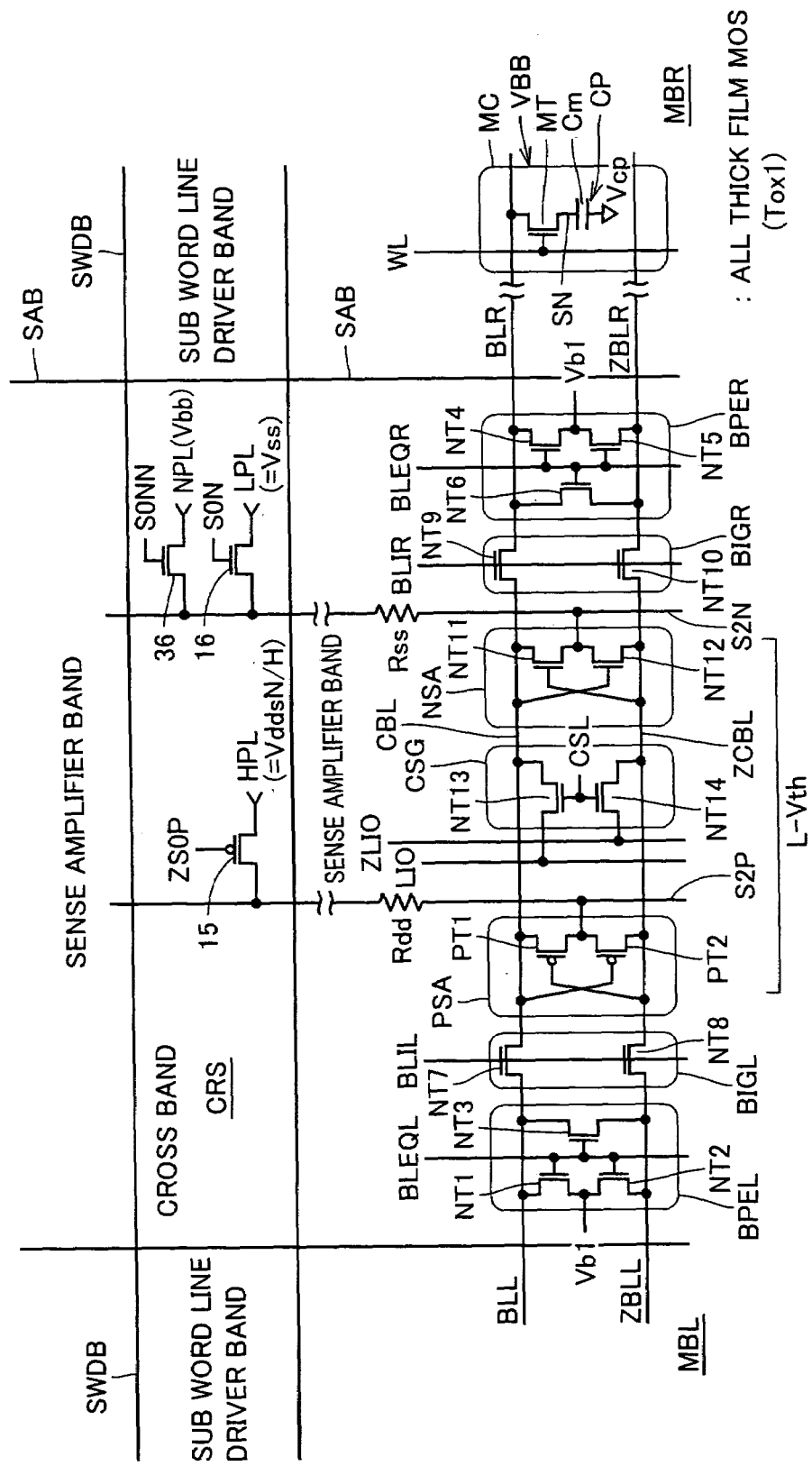
FIG. 11 is a diagram showing the structure of the sense amplifier according to the third embodiment of the present invention.

FIG. 11 is a diagram schematically showing the construction of a main portion of the semiconductor memory device according to the third embodiment of the present invention. In FIG. 11, there is representatively shown the configuration of the portions related to a single cross band. In FIG. 11, to N-sense drive signal line S2N, there are provided an N-sense drive transistor 16 formed of an N-channel MOS transistor which is made conductive in response to sense activation signal S0N, and an N-sense assisting drive transistor 36 formed of an N-channel MOS transistor which is selectively made conductive in response to a complementary sense activation signal S0NN. N-sense drive transistor 16, when made conductive, connects low-side sense power supply main line LPL to N-sense drive signal line S2N, while N-sense assisting drive transistor 36, when made conductive, connects negative power supply line NPL to N-sense drive signal line S2N. Low-side sense power supply main line LPL transfers low-side power supply voltage Vss, and negative power supply line NPL transfers negative voltage Vbb.

The other configuration shown in FIG. 11 is the same as that shown in FIG. 4. The corresponding components are labeled by the same reference characters and the detailed description thereof will not be repeated.

In the construction shown in FIG. 11, N-sense drive signal line S2N is driven toward negative potential Vbb by sense assisting drive transistor 36, to inhibit the potential rise of N-sense drive signal line S2N, and then N-sense drive signal line S2N is driven to the low-side sense power supply voltage Vss level by sense drive transistor 16.

Figure 12:
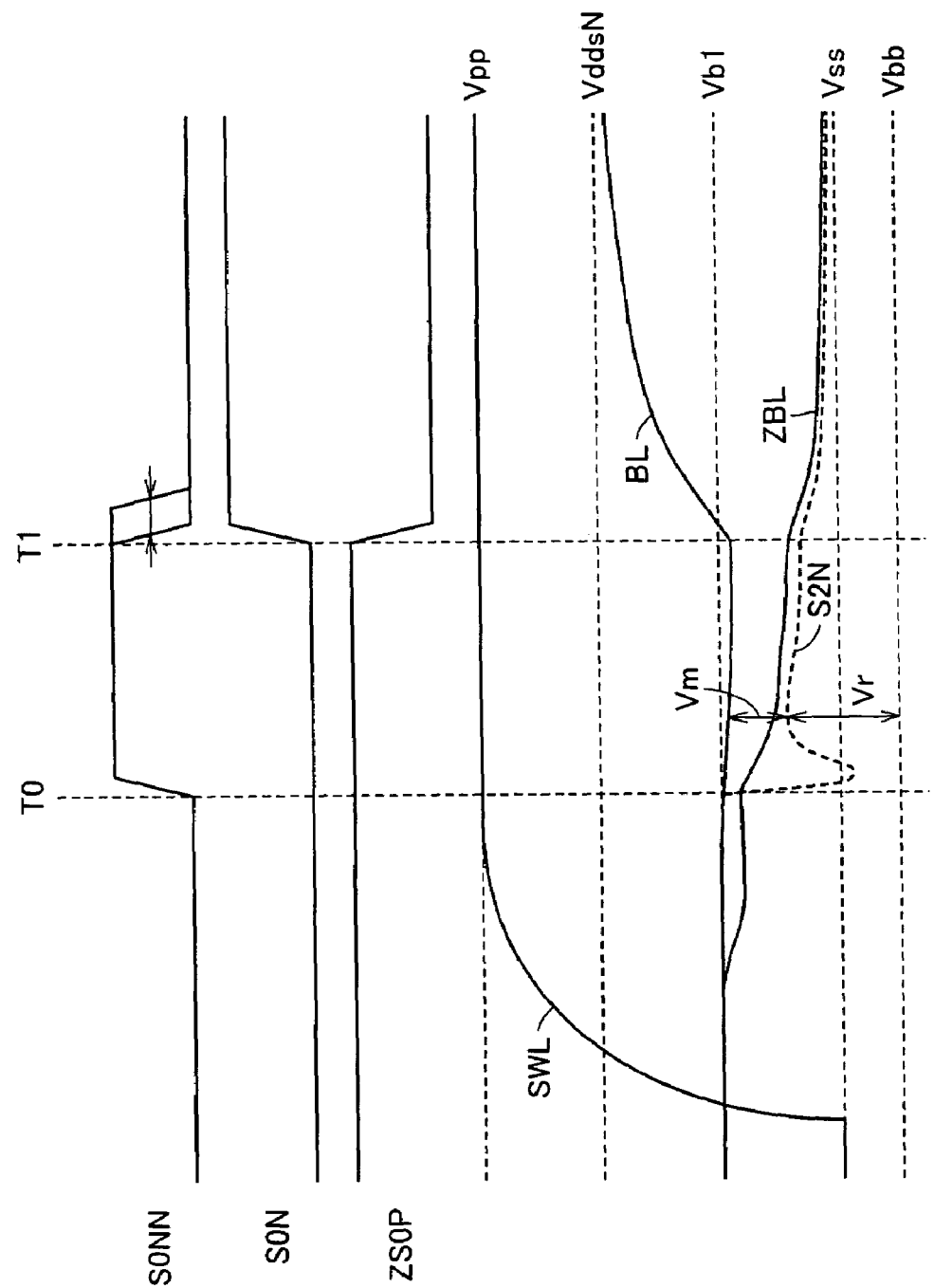
FIG. 12 is a signal waveform diagram representing an operation of the circuit shown in FIG. 11.

FIG. 12 is a signal waveform diagram representing the operation of the circuits within sense amplifier band in the data reading performed in the construction shown in FIG. 11. FIG. 12 exemplifies signal waveforms in the case where bit line BL (BLL or BLR) is utilized as a reference bit line and L-level memory cell data is read out onto bit line ZBL (ZBLR or ZBLL).

In a standby state, bit lines BL and ZBL are precharged and equalized at the intermediate voltage Vb1 level. Further, sense drive signal lines S2N and S2P are equalized at intermediate voltage Vb1 (refer to FIG. 7).

In the standby state, P-sense activation signal ZS0Pis at the H level, and also N-sense activation signal S0N is at the L level and thus sense drive transistors 15, 16 are in the off state. Further, complementary sense activation signal S0NN is at the negative potential Vbb level and sense assisting drive transistor 36 is in the off state.

When an active cycle is started, a word line (sub word line) WL is driven to the selected state according to an address signal and the voltage level of (sub) word line WL rises to the high voltage Vpp level. As the potential at sub word line WL increases, the access transistor of the memory cell connected to bit line ZBL turns conductive, and the voltage level of bit line ZBL drops. Bit line BL serves as a reference bit line and is maintained at the intermediate voltage Vb1 level.

At the time T0, complementary sense activation signal S0NN is activated, causing N-sense assisting drive transistor 36 shown in FIG. 11 turns conductive, and responsively, the voltage level of N-sense drive signal line S2N is driven toward the negative potential Vbb level, and has the voltage level thereof lowered. From the bit line which is to be finally pulled down to the L level, electric charges flow into N-sense drive signal line S2N, to raise the potential on N-sense drive signal line S2N. In this state, negative voltage Vbb is coupled to N-sense drive signal line S2N and therefore even if there is caused a rise of the potential Vr(t) at N-sense drive signal line S2N, the voltage level of N-sense drive signal line S2N is set on the basis of negative voltage Vbb. Accordingly, even though there is caused the same amount of rise Vr(t) in the voltage level of N-sense drive signal line SP2 because of electric charges flew from the plurality of sense amplifiers, the voltage level of N-sense drive signal line S2N relative to ground voltage Vss is sufficiently low. Therefore, the potential difference Vgs between the gate and the source of the L-level-driving MOS transistor in the sense amplifier circuit can be made sufficiently large. Consequently, the L-level-driving MOS transistor in the N-sense amplifier is maintained in the on state, to lower the voltage level of corresponding bit line ZBL.

At the time T1, complementary sense activation signal S0NN is inactivated, while sense activation signals S0N, ZS0P are activated. Thus, bit line BL is driven to the array power supply voltage VddsN level, and complementary bit line ZBL is driven to the voltage level of sense drive signal line S2N and finally driven to low-side power supply voltage (ground voltage) Vss.

By providing the assisting drive transistor for supplying negative potential Vbb as a transistor for driving N-sense drive signal line S2N to control the potential of sense drive signal line S2N at the beginning of the sensing operation, it is possible to set the gate-source voltages of N-channel MOS transistor in the N-sense amplifier to a level which is sufficiently higher than the threshold voltage even under the low power supply voltage condition, achieving stable sensing operation (the aforementioned relation (2) holds over the entire time region).

Also, complementary N-sense activation signal S0NN may be inactivated a little later than the time T1, after the activation of sense activation signal S01.

Figure 13:
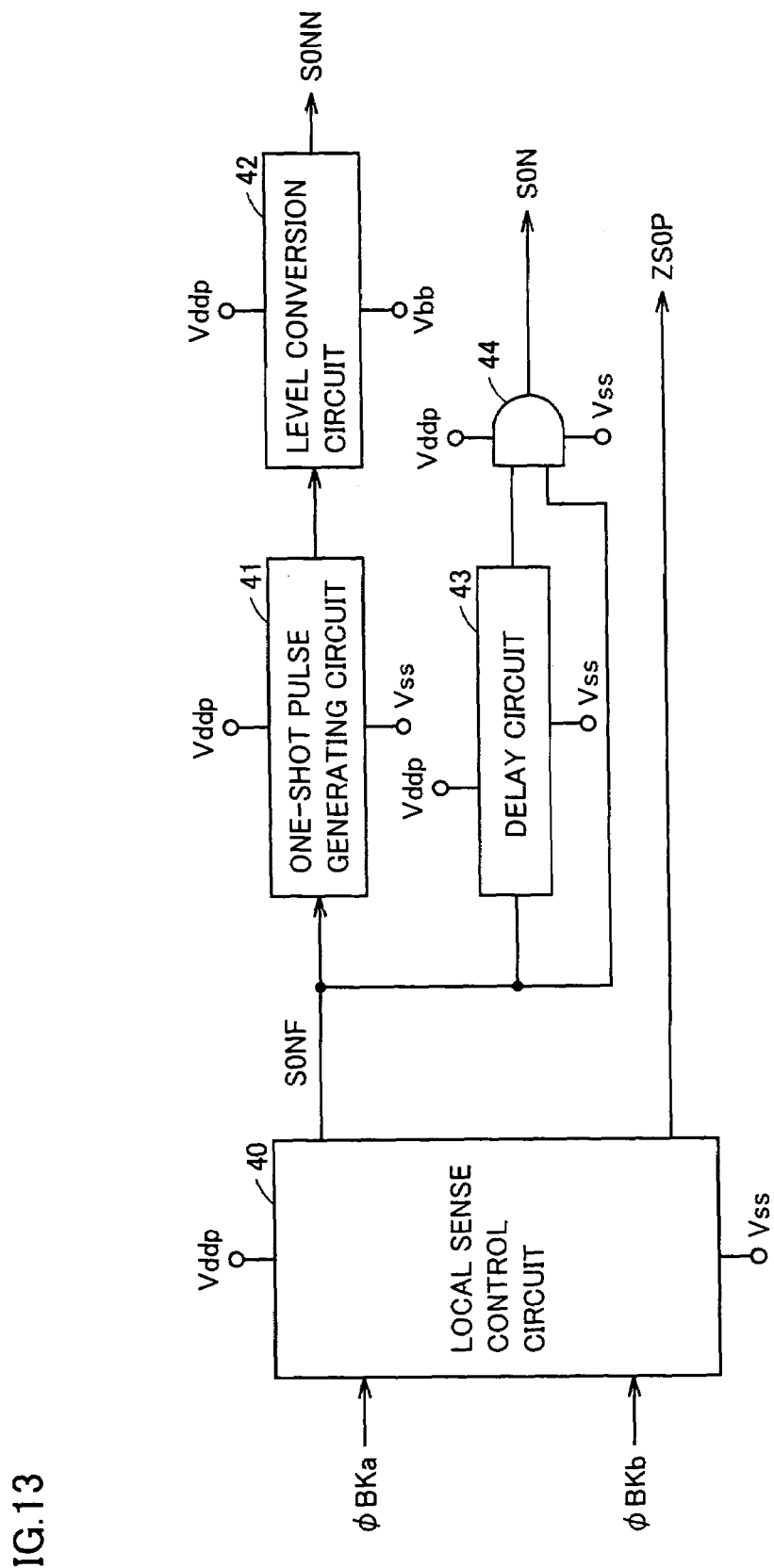
FIG. 13 is a diagram schematically showing an exemplary structure of the portion for generating the sense amplifier control signal activation signal shown in FIG. 11.

FIG. 13 is a diagram schematically showing an exemplary construction of the portion which generates the sense activation signals according to the third embodiment of the present invention. In FIG. 13, the sense activation signal generating portion includes a local sense control circuit 40 for generating an N-sense activation fast signal S0NF and a P-sense activation signal ZS0P in response to a row block designation signal φBKa or φBKb being active, a one-shot pulse generating circuit 41 for generating a one-shot pulse signal in response to N-sense activation fast signal S0NF being active, a level conversion circuit 42 for generating complementary sense activation signal S0NN by converting the level of the output signal of one-shot pulse generating circuit 41, a delay circuit 43 for delaying N-sense activation fast signal S0NF by a predetermined time period, and an AND circuit 44 receiving the output signal from delay circuit 43 and N-sense activation fast signal S0NF to generate N-sense activation signal S0N.

Local sense control circuit 40, one-shot pulse generating circuit 41, delay circuit 43 and AND gate 44 receive peripheral power supply voltage Vddp and low-side power supply voltage Vss (ground voltage) as the operation power supply voltages. Level conversion circuit 42 converts an L-level signal from one-shot pulse generating circuit 41 into the negative voltage Vbb level to generate complementary sense activation signal S0NN having an amplitude of Vddp–Vbb.

Row block designation signals φBKa and φBKb specify row blocks (RBKa, RBKb) which share sense amplified band SAB shown in FIG. 11.

Figure 14:
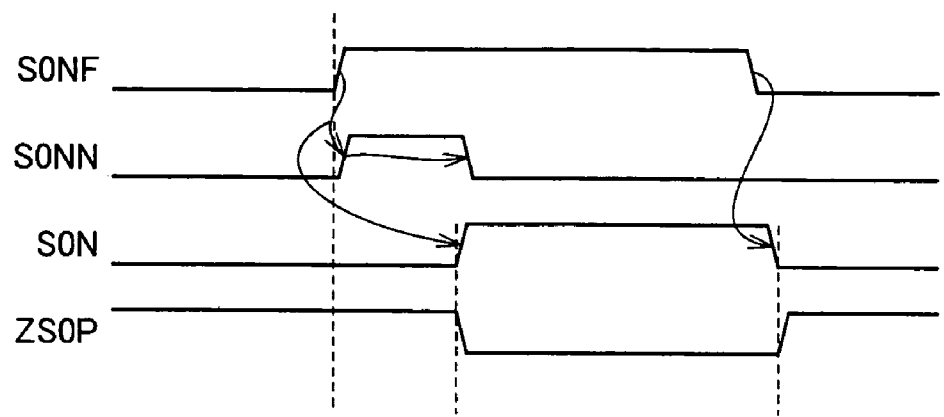
FIG. 14 is a signal waveform diagram representing an operation of the sense amplifier activation signal generating portion shown in FIG. 11.

FIG. 14 is signal waveform diagram representing an operation of the sense control signal generating section shown in FIG. 13. Now, the operation of the sense control signal generating section shown in FIG. 13 will be described with reference to FIG. 13.

In the standby state, sense activation fast signal S0NF and P-sense activation signal ZS0P are both in the inactive state and are at the L level and H level, respectively. When an active cycle is started and the row block designation signal φBKa or φBKb is activated, local sense control circuit 40 activates sense activation fast signal S0NF at a predetermined timing. This N-sense activation fast signal S0NF is activated at the same timing as the conventional N-sense activation signal, for example (refer to FIG. 10). In response to N-sense activation fast signal S0NF being active, one-shot pulse generating circuit 41 generates a one-shot pulse signal, which causes complementary sense activation signal S0NN from level conversion circuit 42 to rise from the negative voltage Vbb level to the peripheral power supply voltage Vddp level. Accordingly, N-sense assisting drive transistor 36 shown in FIG. 11 turns conductive to transfer negative voltage Vbb to N-sense drive signal line S2N. The conduction time period of this N-sense assisting drive transistor 36 is determined by the pulse width of the pulse signal generated from one-shot pulse generating circuit 41. At this time, the output signal from delay circuit 43 is still at the L level and N-sense activation signal S0N is in the inactive state.

When the delay time of delay circuit 43 elapses, the output signal of delay circuit 43 rises to the H level, causing N-sense activation signal S0N from an AND gate 44 to be activated and raised to the peripheral power supply voltage Vddp level. At this time, P-sense activation signal ZS0P from local sense control circuit 40 is activated and driven to the ground voltage level.

The delay time required for delay circuit 43 is appropriately determined according to the pulse width of pulse signal which is generated from one-shot pulse generating circuit 41. The delay time of delay circuit 43 may be set to be equal to the pulse width which is generated from one-shot pulse generating circuit 41 so that the completion of driving of N-sense drive signal line S2P to the negative voltage level and the start of driving it to the ground voltage level occur at the same timing. Further, the delay time of delay circuit 43 may be set so that the activation time period of N-sense activation signal S0N and the activation time period of complementary sense activation signal S0NN are overlapped.

When the active cycle completes, N-sense activation fast signal S0NF is inactivated and also P-sense activation signal ZS0Pis inactivated. Accordingly, N-sense activation signal S0N is inactivated.

In the construction of the sense amplifier control signal generating portion shown in FIG. 13 also, P-sense activation signal ZS0P may be driven to the negative voltage level when made active. The configuration of local sense control circuit 40 may be suitably determined according to the configuration of this semiconductor memory device, similarly to the construction shown in FIG. 9. The sense activation signals may be generated at predetermined timings according to activation of the array activation signal (ACT). Also, this local sense control circuit 40 may be supplied with a main sense amplifier activation signal.

In addition, it is unnecessary to activate P-sense activation signal ZS0P at the same timing as N-sense activation signal S0N. P-sense activation signal ZS0P may be activated at a timing earlier than that of N-sense activation signal S0N (a suitable timing between the time T0 and the time T1, in FIG. 12).

First Modification

Figure 15:
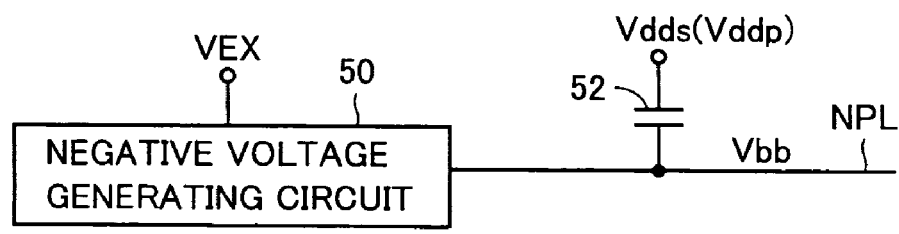
FIG. 15 is a diagram schematically showing the structure of a main part of the first modification according to the third embodiment of the present invention.

FIG. 15 is a diagram schematically showing the construction of the first modification of the third embodiment of the present invention. In the construction shown in FIG. 15, a negative voltage generating circuit 50 generates negative voltage Vbb from external power supply voltage VEX and supplies the generated negative voltage Vbb to negative power supply line NPL. A decouple capacitance 52 is connected to this negative power supply line NPL. The other electrode of this decouple capacitance 52 is connected to a node for supplying array power supply voltage (sensing power supply voltage) Vdds and peripheral power supply voltage Vddp.

Negative voltage generating circuit 50 is included in internal voltage generating circuit 6, and generates negative voltage Vbb at a predetermined voltage level by, for example, a charge pump operation using a capacitor.

In sensing operation, all the sense amplifier circuits included in a single sense amplifier band operate in parallel and discharge the lower-voltage bit lines. At the beginning of sensing, discharged electric charges flow into negative voltage line NPL through 1K N-sense amplifiers from a plurality (for example, 1 K=1024) of bit lines precharged to intermediate voltage Vb1=(½)*VddsN, as previously described. By connecting a sufficiently large decouple capacitance 52 to this negative power supply line NPL, it is possible to reliably suppress the rise of potential on negative power supply line NPL due to electric charges flowing thereinto, thereby reliably suppressing the potential rise at N-sense drive signal line S2N. Decouple capacitance 52 is placed at the periphery of the array and may be placed in the cross band in a sense amplifier band in the memory cell array.

Negative power supply line NPL is arranged in sense amplifier band SAB similarly to the aforementioned arrangement shown in FIG. 7 and connected to the N-sense assisting drive transistor in the cross band. Therefore, by placing decouple capacitance 52 in the cross band in correspondence to the N-sense assisting drive transistor, it is possible to reliably suppress the rise in voltage of negative voltage Vbb of negative power supply line NPL by absorbing discharged electric charges in sensing operation.

Second Modification

Figure 16:
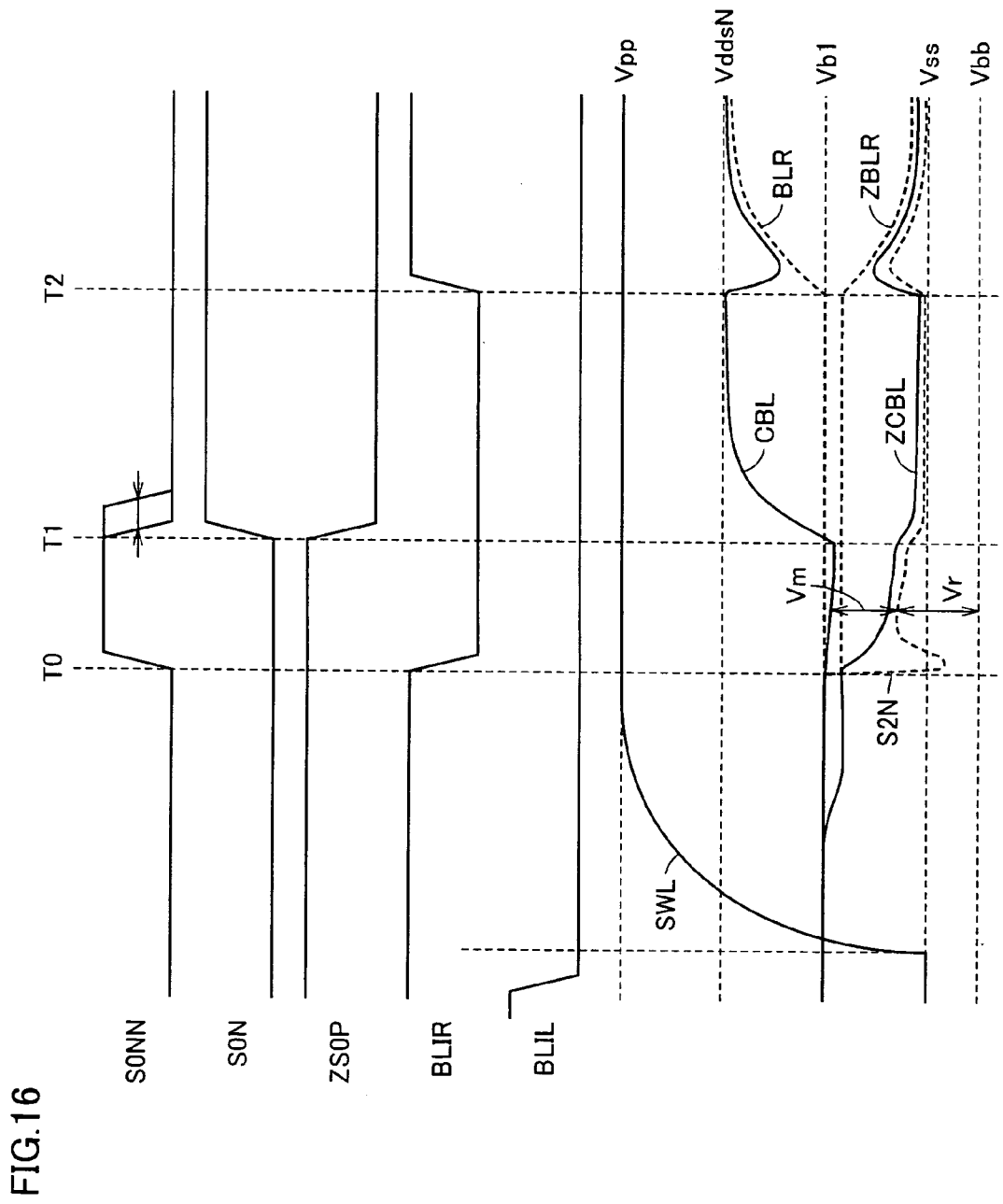
FIG. 16 is a signal waveform diagram representing a sensing operation according to the second modification according to the third embodiment.

FIG. 16 is a diagram showing signal waveforms in sensing operation of the semiconductor memory device according to the second modification according to the third embodiment of the present invention. The construction of the sense amplifier band is the same as that shown in FIG. 11. In the following, the operation of the circuit shown in FIG. 11 in the sensing will be described with reference to FIG. 16.

FIG. 16 shows exemplified signal waveforms in the case where memory block MBR is selected and L level data is read out onto bit line ZBLR.

In a standby cycle, bit line isolation instruction signals BLIR and BLIL are at the H level of the high voltage Vpp level.

When an active cycle is started, bit line isolation instruction signal BLIL falls to the L level, which causes bit line isolation gate BIGL shown in FIG. 11 to enter the off state. Thus, bit lines BLL and ZBLL are isolated from common bit lines CBL and ZCBL, respectively.

Then, according to an address signal, a sub word line for a selected row is driven to the selected state in memory block MBR. As the potential of the selected sub word line SWL rises, the stored data (L level data) in the memory cell connected to selected sub word line SWL is read out onto bit line ZBLR, causing the voltage level of bit line ZBLR to lower. Bit line BLR is maintained at intermediate voltage Vb1 level as in the precharged state. The voltages of bit lines BLR and ZBLR are transferred to common bit lines CBL and ZCBL through bit line isolation gate BIGR shown in FIG. 11.

At the time T0, complementary sense activation signal S0NN is activated to discharge bit line ZBLR at the lower-potential. At this time, bit line isolation instruction signal BLIR is activated to the logical low level or L level, causing bit line isolation gate BIGR shown in FIG. 11 to enter a high resistance state. Since bit line isolation gate BIGR is in the high resistance state, bit lines BLR are ZBLR are capacitively separated from common bit lines CBL and ZCBL. Bit line isolation instruction signal BLIR may be at the low-side sense power supply voltage Vss level and also may be the intermediate voltage level.

Since bit line isolation gate BIGR is brought into the high resistance state and thus the capacitances of the bit lines are separated from corresponding common bit lines, N-sense amplifier NSA discharges common bit line ZCBL at the lower potential of common bit lines CBL and ZCBL according to the voltage of N-sense drive signal line S2N, and according to negative voltage Vbb from negative power supply line NPL. The capacitance associated with these common bit lines CBL and ZCBL is much smaller than a fraction of the capacitance of bit lines BLR and ZBLR, and thus the amount of electric charges discharged from the lower-potential bit line BLR to negative power supply line NPL is drastically reduced, thereby sufficiently suppressing the rise in electrical potential on this N-sense drive signal line S2N. Therefore, even in the case where the capacitance value of decouple capacitance 52 shown in FIG. 15 is small, the voltage Vr(t) shown in FIG. 16 can be sufficiently reduced, enabling to sufficiently increase the potential difference between common bit lines CBL and ZCBL.

At the time T1, sense amplifier activation signals S0N, ZS0P are activated to discharge the lower-potential bit line ZCBL to the low-side power supply voltage Vss level and also charges common bit line CBL to the high-side power supply voltage VddsN level. In charging and discharging of common bit lines CBL and ZCBL, complementary sense activation signal S0NN is in the inactive state and thus sense drive signal line S2N is isolated from negative power supply line NPL.

In sensing operation, since bit lines BLR, ZBLR are capacitively separated from common bit lines CBL, ZCBL and thus there is no electric charge movement between the bit lines and the common bit lines, bit lines BLR and ZBLR are maintained at the voltage levels attaining at time T0.

At the time T2, bit line isolation instruction signal BLIR is driven to the H level of the high voltage level, to bring bit line isolation gate BIGR into the on state to connect common bit lines CBL and ZCBL to bit lines BLR and ZBLR. This causes movement of electric charges to equalize the voltage levels of bit line BLR and common bit line CBL and also equalize the voltage levels of bit lines ZBLR and ZCBL. Thus, bit lines BLR and ZBLR are driven to the voltage VddsN level and the Vss level, respectively. By these voltages of bit lines BLR and ZBLR, rewriting of data into selected memory cells are performed to restore the data. The H level of the stored data in memory cells is the array power supply voltage Vdds level and the L level is the low-side sense power supply voltage Vss level.

By performing sensing operations according to a so-called "charge confinement method" in which sensing operation is performed with common bit lines CBL and ZCBL isolated from bit lines BLR and ZBLR, it is possible to suppress the rise in potential on the sense drive signal line, thereby sufficiently enlarging the gate-source potential difference Vm of the MOS transistor in the N-sense amplifier. This enables high speed, stable sensing operation even under low power supply voltage condition.

Also, in the signal waveform diagram shown in FIG. 16, P-sense activation signal ZS0P may be activated at an appropriate timing between the times T0 and T1. Also, complementary sense activation signal S0NN may be inactivated after the activation of N-sense activation signal S0N.

Figure 17:
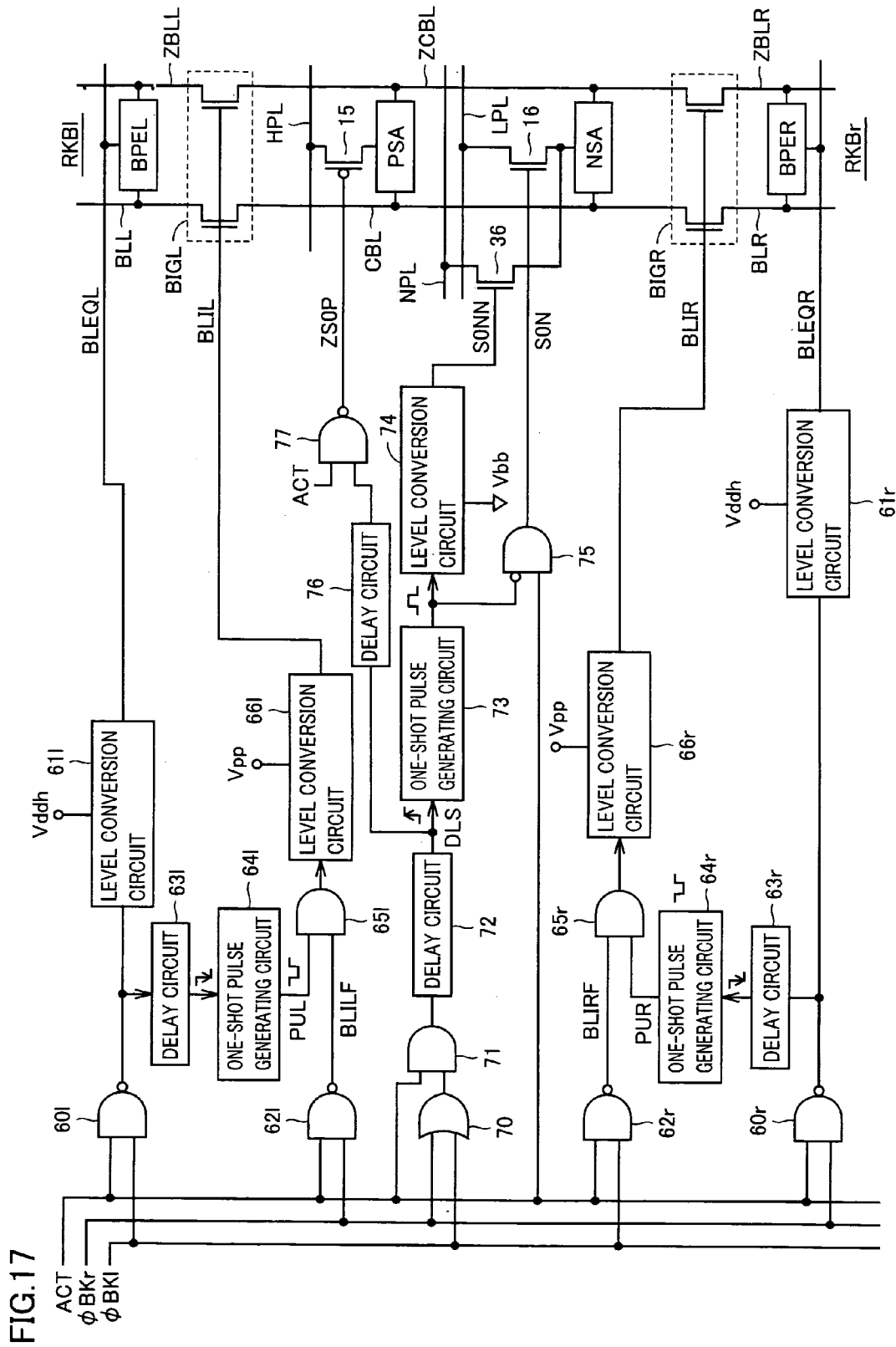
FIG. 17 is a diagram schematically showing an exemplary structure of the local control circuit for executing the sensing operation according to the third embodiment of the present invention.

FIG. 17 is a diagram schematically showing an exemplary construction of the local control circuit for implementing the sensing operation shown in FIG. 16. In FIG. 17, there is representatively shown the construction of the local control circuit provided for the sense amplifier band shared by memory row blocks RKB1 and RKBr. In memory row blocks RKB1 and RKBr, bit lines BLL, ZBLL and BLR, ZBLR are representatively shown, respectively. The constructions of the peripheral circuitry of bit lines BLL, ZBLL and BLR, ZBLR are the same as the constructions shown in FIG. 11, and the corresponding components are labeled by the same reference numerals and the detailed description thereof will not be repeated.

Sense drive transistors 16, 15 and 36 arranged in the cross band are shown being provided to common bit lines CBL and ZCBL.

The local control circuit includes a NAND circuit 601 which receives array activation signal ACT and row block designation signal φBK1, a level conversion circuit 611 which performs a level conversion on the output signal of NAND circuit 601 to generate bit line equalizing instruction signal BLEQL and supplies it to bit line equalizing circuit BPEL, a NAND circuit 621 which receives array activation signal ACT and row block designation signal φBK1, a delay circuit 631 for delaying the output signal of NAND circuit 601 by a predetermined time, a one-shot pulse generating circuit 641 which generates an one-shot pulse signal PUL that is maintained at an L level for a predetermined time period, in response to the fall of the output signal of delay circuit 631, an AND circuit 651 which receives the output signal BLILF of NAND circuit 621 and output pulse signal PUL of one-shot pulse generating circuit 641, and a level conversion circuit 661 which performs a level conversion on the output signal of AND circuit 651 to generate bit line isolation instruction signal BLIL and supplies it to bit line isolation gate BIGL.

Array activation signal ACT is maintained at the active state for a time period in which a row is in the selected state since the memory cell selecting operation is started in this semiconductor memory device. Row block designation signal φBKr, when activated, specifies memory row block RKBr and row block designation signal φBK1, when activated, specifies memory row block RKB1. Level conversion circuit 611 generates bit line equalizing instruction signal BLEQL at the voltage Vddh level, which is higher than the array power supply voltage Vdds. Level conversion circuit 661 generates bit line equalizing instruction signal BLIL having an H level at the high voltage Vpp level.

The local control circuit includes a NAND circuit 60r which receives array activation signal ACT and row block designation signal φBKr, a level conversion circuit 61r which performs a level conversion for the output signal of NAND circuit 60r to generate bit line equalizing instruction signal BLEQR and supplies it to bit line equalizing circuit BPER, a NAND circuit 62r which receives array activation signal ACT and row block designation signal φBK1, a delay circuit 63r for delaying the output signal of NAND circuit 60r by a predetermined time, a one-shot pulse generating circuit 64r which generates an one-shot pulse signal PUR which is maintained at an L level for a predetermined time period in response to the fall of the output signal of delay circuit 63r, an AND circuit 65r which receives the output signal BLILF of NAND circuit 62r and pulse signal PUR output from one-shot pulse generating circuit 64r, and a level conversion circuit 66r which performs a level conversion on the output signal of AND circuit 65r to generate bit line isolation instruction signal BLIR and supplies it to bit line isolation gate BIGR.

Level conversion circuit 61r generates bit line equalizing instruction signal BLEQE having an H level at the voltage Vpph level. Level conversion circuit 66r generates bit line separation instruction signal BLIR which changes between high voltage Vpp and low-side power supply voltage (ground voltage) Vss. Delay circuits 63r and 631 have the same delay time.

The local control circuit includes an OR circuit 70 which receives block designation signals φBKr and φBK1, an AND circuit 41 which receives the output signal of OR circuit 70 and array activation signal ACT, a delay circuit 72 which delays the output signal of AND circuit 41 by a predetermined time, an one-shot pulse generating circuit 73 which generates an one-shot pulse signal having a predetermined pulse width in response to the rise of the output signal DLS of delay circuit 72, a level conversion circuit 74 which performs a level conversion on the output signal of one-shot pulse generating circuit 73 to generate complementary sense activation signal S0NN and supplies it to the gate of N-sense assisting drive transistor 36, a gate circuit 75 which receives the output signal of one-shot pulse generating circuit 73 and array activation signal ACT, to generate N-sense activation signal S0N and supplies it to the gate of sense drive transistor 16, a delay circuit 76 which further delays the output signal DLS of delay circuit 72, a NAND circuit 77 which receives the output signal of delay circuit 76 and array activation signal ACT, to generate P-sense activation signal ZS0P and supplies it to the gate of sense drive transistor 15. These circuits 70 to 77 constitute the local sense control circuit previously shown in FIG. 13.

Level conversion circuit 74 sets the L level of complementary sense activation signal S0NN to the negative voltage Vbb level to stop supplying the negative voltage on negative power supply line NPL to N-sense amplifier NSA. Gate circuit 75 sets N-sense activation signal S0N to an L level for the time period in which the output signal of one-shot pulse generating circuit 73 is at an H level. When the output signal of one-shot pulse generating circuit 73 falls to an L level, gate circuit 75 generates N-sense activation signal S0N according to array activation signal ACT. After the negative voltage is supplied from negative power supply line NPL to sense drive signal line S2N in N-sense amplifier NSA, low-side sense power supply line LPL is connected to N-sense amplifier NSA through N-sense drive transistor 16. The activation time periods of sense activation signals S0N are ZS0P are substantially the same and for P-sense amplifier PSA, the sensing high-side power supply main line HPL is connected to P-sense amplifier PSA through P-sense drive transistor 15.

Figure 18:
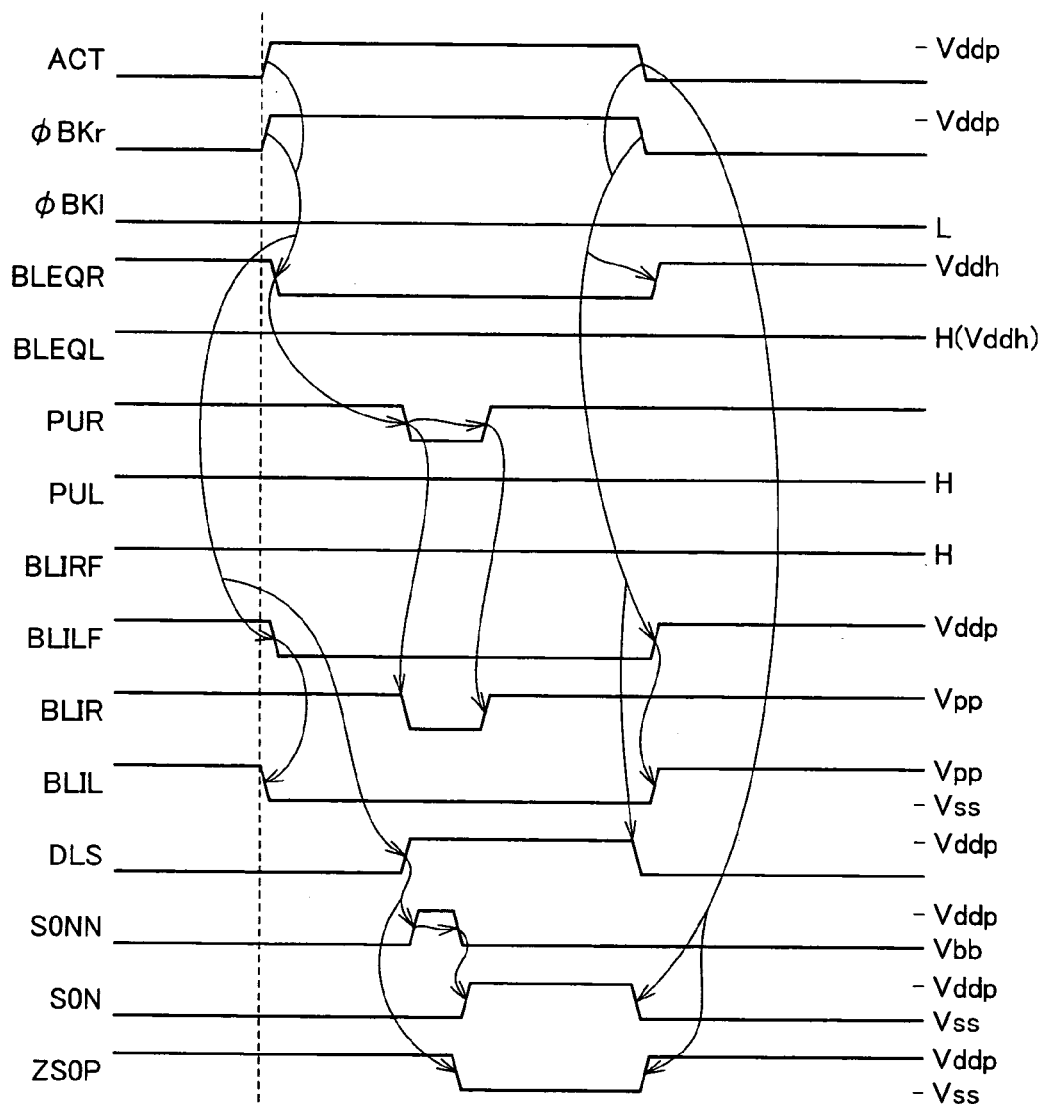
FIG. 18 is a signal waveform diagram representing an operation of the local control circuit shown in FIG. 17.

FIG. 18 is a signal waveform diagram representing the operation of the local control circuit shown in FIG. 17. Now, the operation of the local control circuit shown in FIG. 17 will be described, with reference to FIG. 18.

FIG. 18 represents the signal waveforms in the case where memory row block RBKr is selected. In FIG. 17, the operation power supply voltage to the gate circuits is peripheral power supply voltage Vddp, although not shown.

In the standby cycle, array activation signal ACT is at the L level, and also row block designation signals φBKr and φBK1 are at the L level. At this state, bit line equalizing instruction signals BLEQR, BLEQL are at the voltage Vddh level, and bit line isolation instruction signals BLIL and BLIR are also at the high voltage Vpp level. N-sense activation signal S0N is at the L level of the ground voltage Vss level, and P-sense activation signal ZS0P is at the peripheral power supply voltage Vddp level. Complementary sense activation signal S0NN is at the negative voltage Vbb level. Thus, the sense drive transistors are all in the off state, and the sense drive signal lines S2P and S2N are at the intermediate voltage level.

When an active cycle is started, array activation signal ACT rises to the H level, and row block designation signal φBKr rises to the H level according to an address signal. Row block designation signal φBK1 is at the L level.

When both array activation signal ACT and row block designation signal φBKr rise to the H level, the output signal from NAND circuit 60r shown in FIG. 17 falls to the L level and accordingly bit line equalizing instruction signal BLEQR from level conversion circuit 61r falls to the L level, causing bit line equalizing circuit BPER to be inactivated. Row block designation signal φBK1 is at the L level, and therefore the output signal of NAND circuit 601 is at the H level. Thus, bit line equalizing instruction signal BLEQL from level conversion circuit 611 is at the H level (Vddh level), and bit lines BLL and ZBLL are equalized at a predetermined voltage level, which is the intermediate voltage level, by bit line equalizing circuit BPEL.

Further, the output signal BLILF of NAND circuit 621 falls to the L level, and accordingly bit line isolation instruction signal BLIL from level conversion circuit 661 falls to the L level. Thus, bit line isolation gate BIGL is brought into the off state, causing bit lines BLL and ZBLL to be isolated from common bit lines CBL and ZCBL. NAND circuit 62r receives row block designation signal φBK1, and its output signal BLIRF is at the H level. Thus, bit line isolation instruction signal BLIR is at H level, and thus bit lines BLR and ZBLR are connected to common bit lines CBL and ZCBL.

When a predetermined time elapses since the output signal of NAND circuit 60r falls, the output signal of delay circuit 63r falls to the L level, and responsively pulse signal PUR from one-shot pulse generating circuit 64r is maintained at the L level for a predetermined time period. Accordingly, the output signal of AND circuit 65r falls to the L level, and bit line isolation instruction signal BLIR falls to the L level, causing bit lines BLR and ZBLR to be isolated from common bit lines CBL and ZCBL.

On the other hand, the output signal of OR circuit 70 is at the H level and also the output signal of AND circuit 71 is at the H level according to array activation signal ACT being active. When the delay time required for delay circuit 72 elapses since the active cycle starts, the output signal DLS of delay circuit 72 rises to the H level. The timing of the start of sensing is determined by the output signal DLS of delay circuit 72. In response to the output signal DLS of delay circuit 72 rising, one-shot pulse generating circuit 73 generates a one-shot pulse signal, and thus complementary sense activation signal S0NN from level conversion circuit 74 rises to the H level. Consequently, negative power supply line NPL is connected to N-sense amplifier NSA through sense assisting drive transistor 35. At this time, N-sense activation signal S0N output from gate circuit 75 is at the L level.

When the delay time of delay circuit 76 elapses, P-sense activation signal ZS0P from NAND circuit 77 falls to the L level, causing P-sense drive transistor 15 to turn conductive. Consequently, P-sense amplifier PSA is connected to high-side power supply main line HPL. At this time, the one-shot pulse signal from one-shot pulse generating circuit 73 falls to the L level, causing N-sense activation signal S0N from gate circuit 75 to be activated. Thus, N-sense drive transistor 16 turns conductive to connect N-sense amplifier NSA to low-side sensing power supply main line LPL.

When a predetermined time elapses since the start of the sensing operation, pulse signal PUR from one-shot pulse generating circuit 64r rises to the H level again, and thus bit line isolation instruction signal BLIR from level conversion circuit 66r rises to the H level (the high voltage Vpp level). Thus, restoring of data of the memory cells connected to bit lines BLR and ZBLR is performed.

When the active cycle completes array activation signal ACT is inactivated, and row block designation signal φBKr is inactivated. Thus, bit line isolation instruction signal BLIL rises to the H level. Further, the output signal DLS of delay circuit 72 falls to the L level, and accordingly sense activation signals S0N, ZS0P are inactivated, returning to the standby state.

With the local control circuit shown in FIG. 17, for a predetermined time period, or for the time period in which source drive signal line S2N of the N-sense amplifier is connected to negative power supply main line NPL, bit line isolation instruction signal BLIR is set to the L level to perform the sensing operation.

Also, in the case where row block RBK1 is selected, exchange between the control signals for row block RBKr and the control signals for row block RBK1 can provides the operation waveforms in the waveform diagram shown in FIG. 18.

Also, N-sense activation signal S0N may be activated by a delayed signal of the activation of array activation signal ACT while inactivating complementary sense activation signal S0NN in response to N-sense activation signal S0N being active. The inactivation of the N-sense activation signal is performed by the inactivation of array activation signal ACT. In this construction, complementary sense activation signal S0NN may be inactivated after the activation of N-sense activation signal S0NN. Further, by setting the delay time of delay circuit 76 to an appropriate value, P-sense activation signal ZS0P can be activated during driving of the N-sense amplifier to the negative power supply.

Modification of Local Control Circuit

Figure 19:
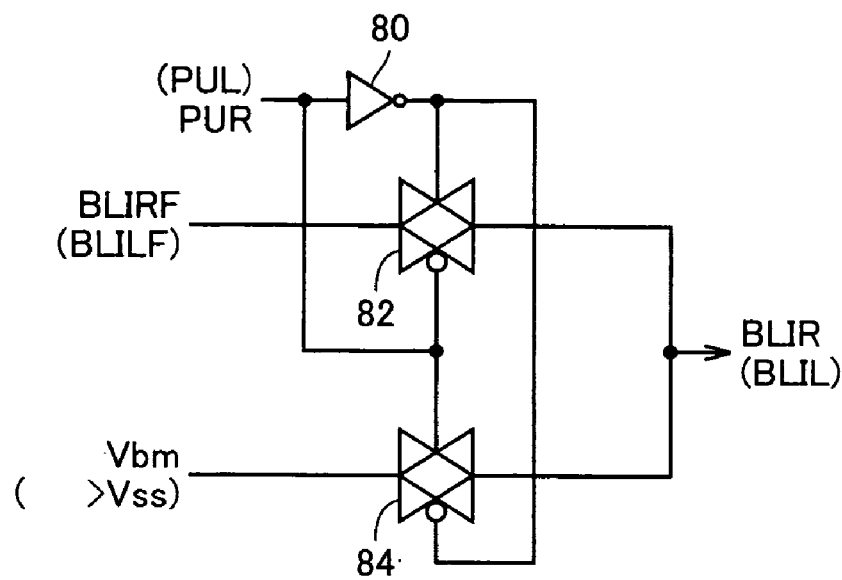
FIG. 19 is a schematic diagram showing a main part of a modification of the local control circuit shown in FIG. 17.

FIG. 19 is a diagram showing a modification of the local control circuit shown in FIG. 17. FIG. 17 shows the construction of the section for generating bit line isolation instruction signal BLIR. Bit line isolation instruction signal BLIL may be generated using the same construction as the construction shown in FIG. 19. Therefore, in FIG. 19, the construction of the section for generating bit line isolation instruction signal BLIL is shown by indicating corresponding signals in parentheses.

In FIG. 19, the bit line isolation instruction signal generating section includes an inverter 80 which receives pulse signal PUR from one-shot pulse generating circuit 64*r* shown in FIG. 17, a CMOS transmission gate 82 which turns conductive when the output signal of inverter 80 is at the H level and transfers, when conductive, the output signal BLIR from NAND circuit 62*r* shown in FIG. 17, and a CMOS transmission gate 84 which turns conductive when the output signal of inverter 80 is at the L level and transfers, when conductive, an intermediate voltage Vbm. The CMOS transmission gates 82 and 84 generate bit line isolation instruction signal BLIR. Intermediate voltage Vbm is at a voltage level higher than low-side power supply voltage (ground voltage) Vss.

Figure 20:
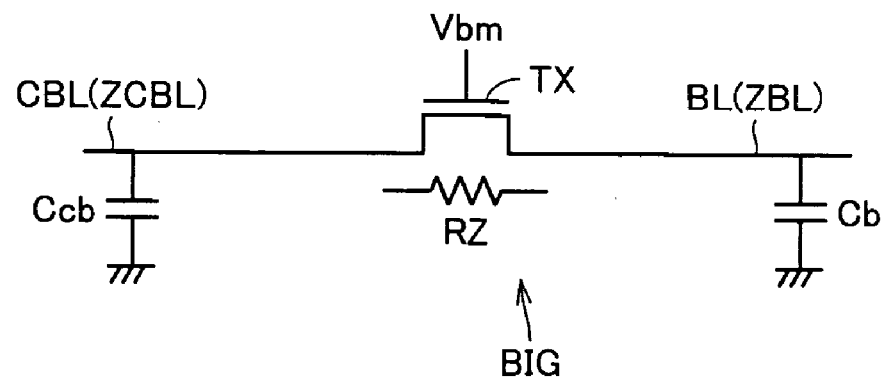
FIG. 20 is a diagram illustrating a connection manner between a bit line and a common bit line upon application of the bit line isolation instruction signal shown in FIG. 19.

As shown in FIG. 20, in sensing operation with the charge confinement method, the gate of a transfer gate TX of bit line isolation gate BIG is supplied with intermediate voltage Vbm. In this state, bit lines BL and CBL are connected to each other through an on-resistance RZ of transfer gate TX. Bit line BL has a parasitic capacitance Cb, and common bit line CBL has a parasitic capacitance Cc. If on-resistance value RX is sufficiently high, parasitic capacitance Cb and resistance RZ constitute a delay circuit, which sufficiently suppresses the movement of electric charges from bit line BL to common bit line CBL to equivalently disconnect parasitic capacitances Ccb and Cb from each other. Accordingly, even when the voltage Vbm is at the intermediate voltage level, transfer gate TX is in a high resistive on-state, thereby enabling to discharge the electric charges charged at parasitic capacitance Ccb of common bit line CBL to negative power supply line NPL through N-sense drive signal line, without movement of the electric charges of parasitic capacitance Cb of the bit line.

For the transfer gate TX provided between bit lines ZBL and ZCBL, the same operation is carried out.

For bit line isolation instruction signal BLIL, in the construction shown in FIG. 19, when the output pulse PUL from one-shot pulse generating circuit 64*l* shown in FIG. 17 is at the L level, intermediate voltage Vbm is selected and accordingly the voltage level of bit line isolation instruction signal BLIL is lowered.

Accordingly, when N-sense drive signal line is connected to this negative power supply line, even though bit line isolation gate BIG is not set to a completely off state and is maintained at a high resistive, conductive state, the movement of electric charges from bit line BL (BLL or BLR) or ZBL (ZBLL or ZBLR) to common bit line CBL or ZCBL can be sufficiently suppressed. This enables sufficiently suppressing of the rise in potential of N-sense drive signal line S2P.

Third Modification

Figure 21:
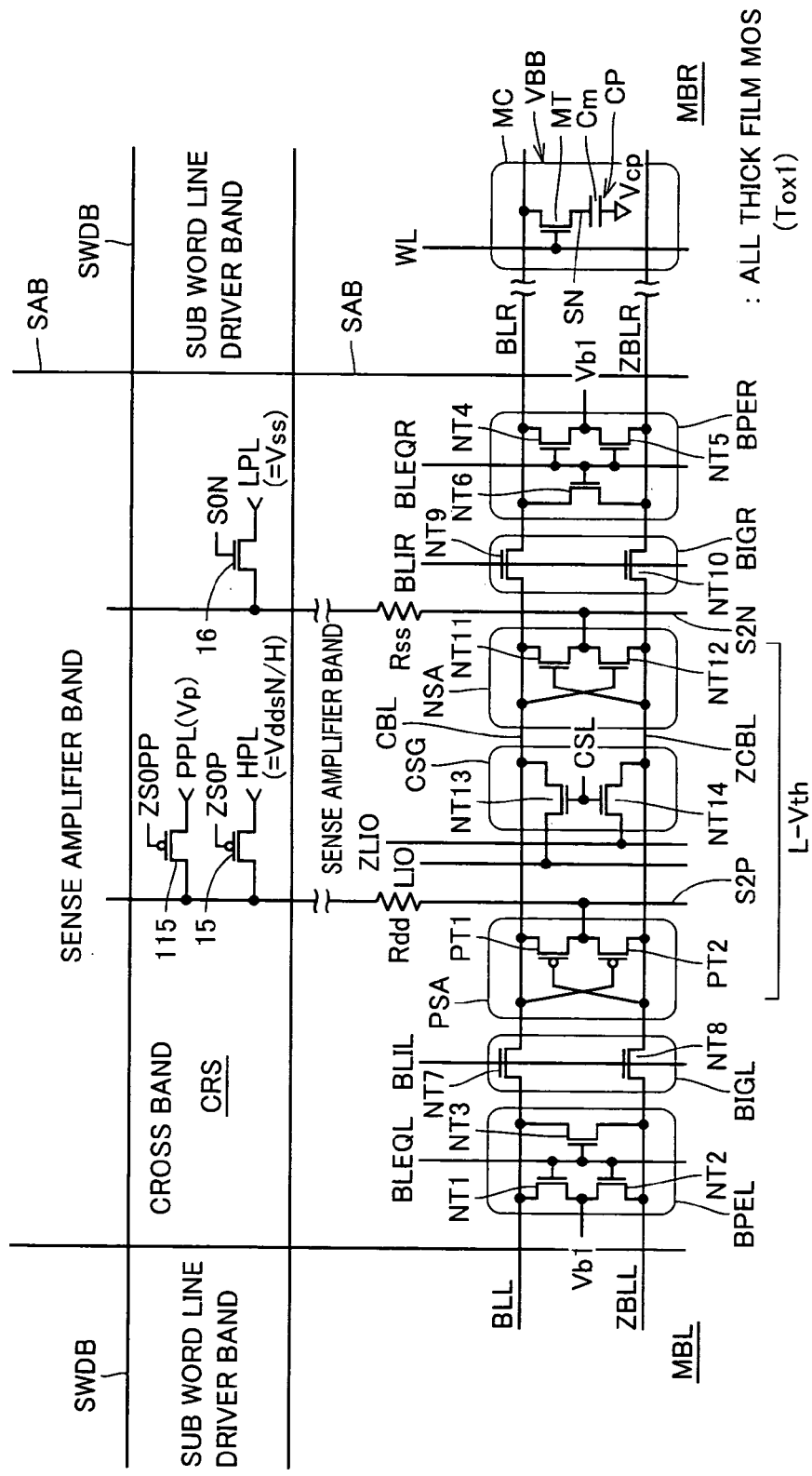
FIG. 21 is a diagram showing a third modification of the third embodiment according to the present invention.

FIG. 21 is a diagram showing the construction of a third modification of the third embodiment of the present invention. In the construction shown in FIG. 21, for P-sense drive signal line S2P, in parallel with P-sense drive transistor 15 which is rendered conductive in response to P-sense activation signal ZS0P, there is provided a P-sense assisting drive transistor 115 formed of a P-channel MOS transistor which is rendered conductive in response to complementary P sense activation signal ZS0PP and connects, when conductive, P-sense drive signal line S2P to a high power supply voltage PPL. High power supply line PPL transfers a voltage Vp higher than array power supply voltage Vdds. This high voltage Vp may be at the same potential as high voltage (boosted voltage) Vpp which is transferred to a selected word line and also may be a high voltage which is generated from a separate voltage generating circuit.

For N-sense drive signal line S2N, there is provided an N-sense drive transistor 16 which is rendered conductive in response to N-sense activation signal S0N. This N-sense drive transistor 16, when conductive, connects low-side power supply main line LPL to N-sense drive signal line S2N.

The constructions of the bit line peripheral circuits and the sense amplifiers shown in FIG. 21 are the same as those shown in FIG. 11. The corresponding components are labeled by the same reference characters and the detailed description thereof will not be repeated.

In the construction shown in FIG. 21, in sensing operation, P-sense drive signal line S2P is driven in two steps. This can sufficiently increase the potential difference between common bit lines CBL and ZCBL and sense drive signal lines S2P and S2N.

Figure 22:
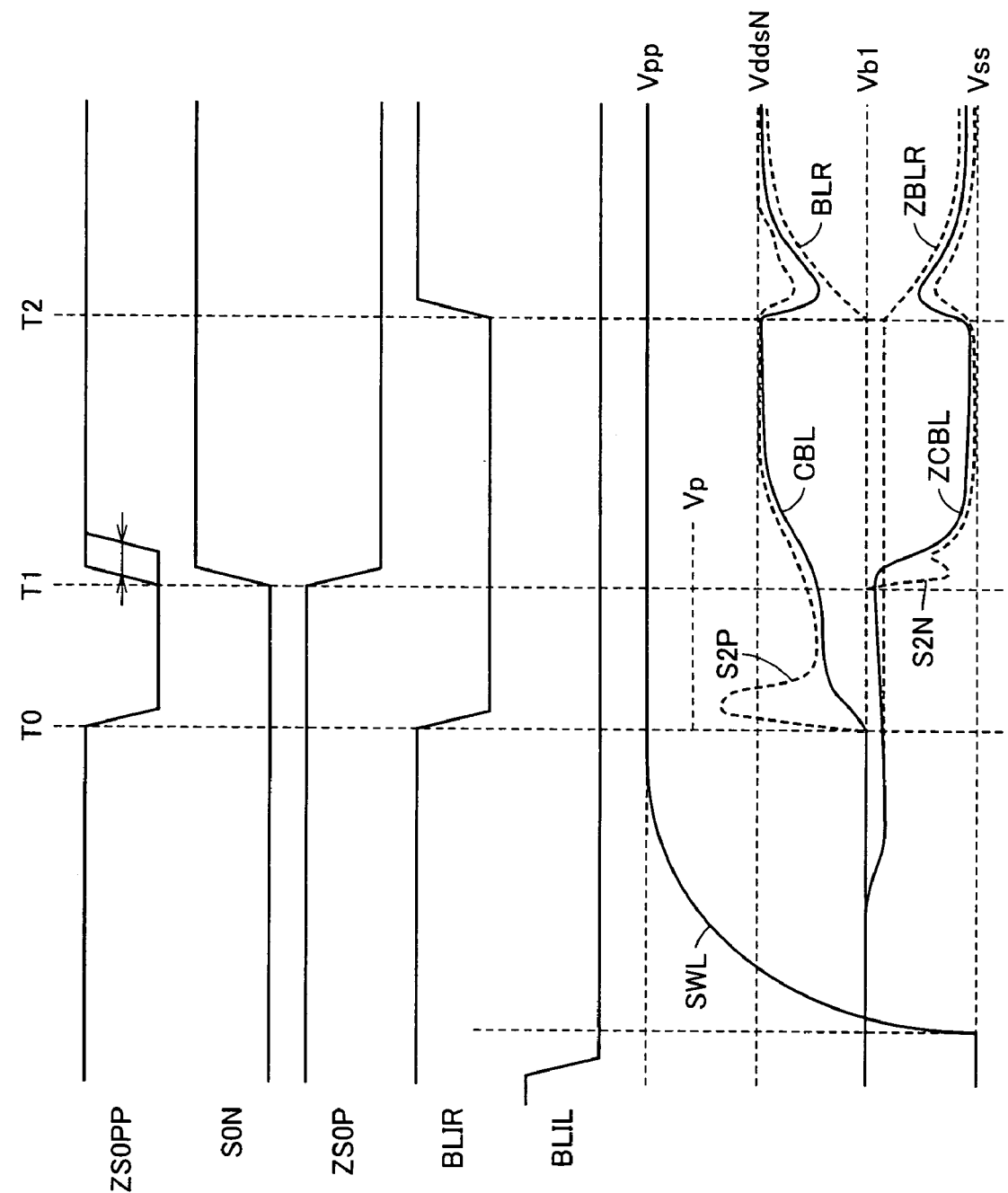
FIG. 22 is a diagram representing signal waveforms in sensing operation of the circuitry in the sense amplifier band shown in FIG. 21.

FIG. 22 is signal waveform diagram representing the operation of the circuitry in the sense amplifier band shown in FIG. 21. In FIG. 22, there is shown the signal waveforms in the case where memory block MBR is selected and L level data is read out.

When an active cycle is started, bit line isolation instruction signal BLIL falls to the L level based on row a block selection signal selecting a row block including memory block MBR according to an address signal. Thus, bit line isolation gate BIGL shown in FIG. 21 is brought into the off state. At this state, sense drive signal lines S2P and S2N are maintained at the intermediate voltage Vb1 level.

Row selecting operation is performed according to an address signal, and sub word line SWL corresponding to a selected row is driven to the selected state and finally up to the high voltage Vpp level. According to the potential rise on the selected sub word line, memory cells are selected in memory block MBR and the data in the selected memory cells are read out on the corresponding bit lines. In FIG. 22, L level data is read out on bit line ZBLR. Bit line BLR is maintained at the intermediate voltage Vb1 level of the precharge voltage level.

At the time T0, P assisting sense activation signal ZS0PP falls to the L level. Thus, sense assisting drive transistor 115 shown in FIG. 21 turns conductive to connect sense drive signal line S2P to high power supply line PPL. Accordingly, the voltage level of sense drive signal line S2P rises. Before the potential of P-sense drive signal line S2P rises to high voltage Vp, electric charges move due to charging of the higher potential bit line, to lower the potential level of P-sense drive signal line S2P. Then, the potential level of P-sense drive signal line S2P rises with the voltage level of common bit line CBL. At this time, at the time T0, bit line isolation instruction signal BLIR falls to the low level, and thus bit line isolation gate BIGR is set to the high resistance state. In sensing operation under the condition that the and sense drive signal line S2P is connected to high voltage line PPL, the sensing operation is performed with bit lines BLR and ZBLR being separated from common bit lines CBL and ZCBL.

As the potential of common bit line CBL rises, the potential level of complementary common bit line ZCBL also rises due to the capacitive coupling. In driving the higher-potential common bit line CBL, since the sensing operation is performed along the so-called charge confinement method and the amount of electric charges driven from the P sense drive signal line S2P is small, the potential of the common bit line corresponding to the higher potential bit line can be raised at high speed (potential drop of sense drive signal line S2P can be sufficiently suppressed). Therefore, in P-sense amplifier, a potential difference greater than the absolute values of the threshold voltages of MOS transistors PT1 and PT2 can be generated in the P-channel MOS transistor connected to the higher potential bit line. Thus, the sensing operation can be performed reliably.

At the time T1, P assisting sense activation signal ZS0PP is inactivated and sense activation signals S0N and ZS0P are driven to the active state. At this time, a large potential difference has been generated between common bit lines CBL and ZCBL and thus, the sensing operation can be performed while the MOS transistors in P-sense amplifier and N-sense amplifier are reliably set to the on state. Thus, common bit lines CBL and ZCBL are driven to the array power supply voltage VddsN level and the low-side power supply voltage (ground voltage) Vss level, respectively.

At the time T2, bit line isolation instruction signal BLIR is set to the H level. Thus, bit line isolation gate BIGR in the high resistance state is set to a low resistance state, thereby causing electric charges to move between common bit lines CBL, ZCBL and bit lines BLR, ZBLR, for performing restoring of data for the selected memory cell.

As shown in FIG. 21, even in the case of the two-step driving of P-sense drive signal line S2P, by performing the initial sensing operation along the charge confinement method, a potential drop at P-sense drive signal line S2P can be suppressed to reliably increase the potential difference between common bit lines CBL and ZCBL. This achieves stable, high speed sensing operation.

Figure 23:
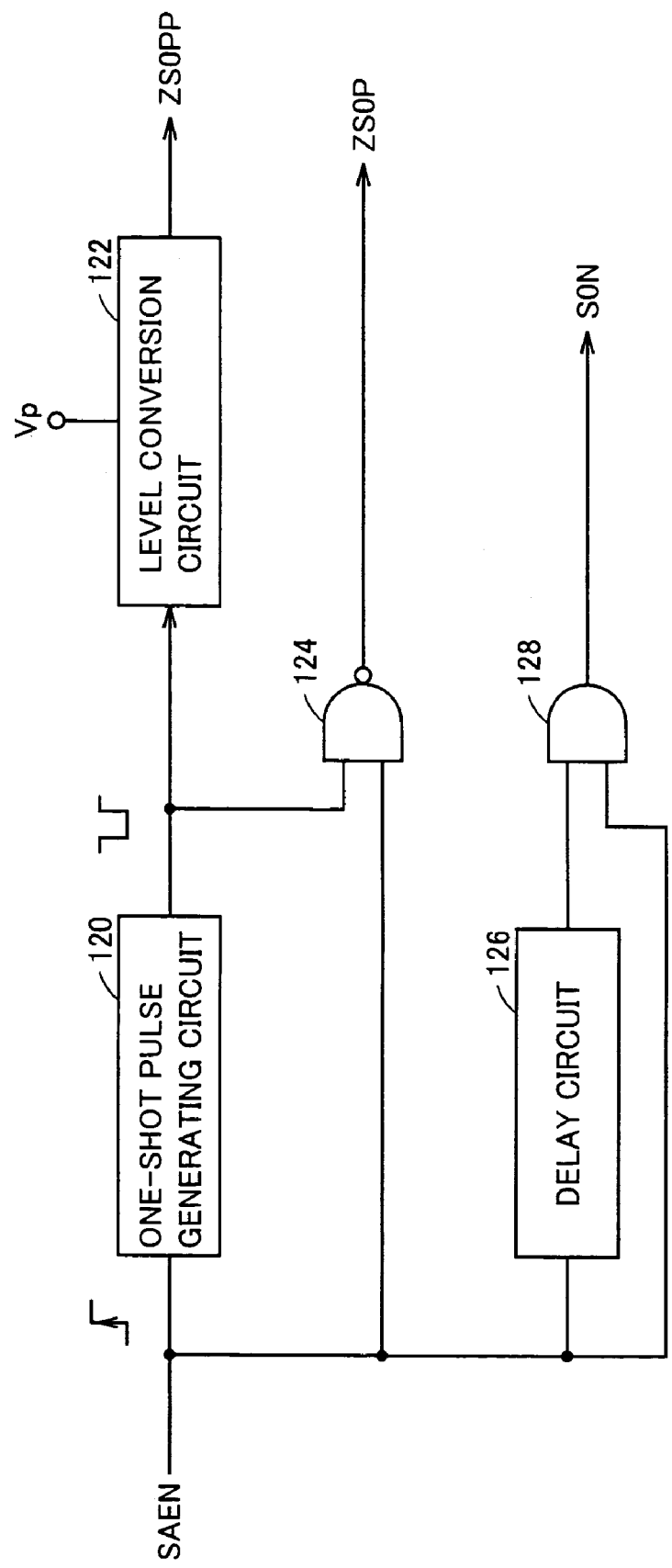
FIG. 23 is a diagram showing a construction of a portion for generating a sense activating signal shown in FIG. 21.

FIG. 23 is a diagram schematically showing the construction of the portion which generates the sense amplifier activation signals, according to the fourth modification of the third embodiment of the present invention. In FIG. 23, the sense activation signal generating portion includes an one-shot pulse generating circuit 120 for generating an one-shot pulse signal which is maintained at the L level for a predetermined time period in response to a sense amplifier activation signal SAEN being active, a level conversion circuit 122 which converts the level of the pulse signal from one-shot pulse generating circuit 120 to generate P assisting sense activation signal ZS0PP, a NAND circuit 124 which receives the output pulse signal of one-shot pulse generating circuit 120 and sense amplifier activation signal SAEN, to generate P-sense activation signal ZS0P, a delay circuit 126 which delays sense amplifier activation signal SAEN by a predetermined time, and an AND circuit 128 which receives an output signal of delay circuit 126 and sense amplifier activation signal SAEN, to generate N-sense activation signal S0N.

Sense amplifier activation signal SEAN corresponds to the output signal DLS of delay circuit 72 shown in FIG. 17, for example, and sets the timing of start of the sensing operation. When the voltage Vp is higher than peripheral power supply voltage Vddp, level conversion circuit 122 converts the H level into the high voltage Vp level.

Figure 24:
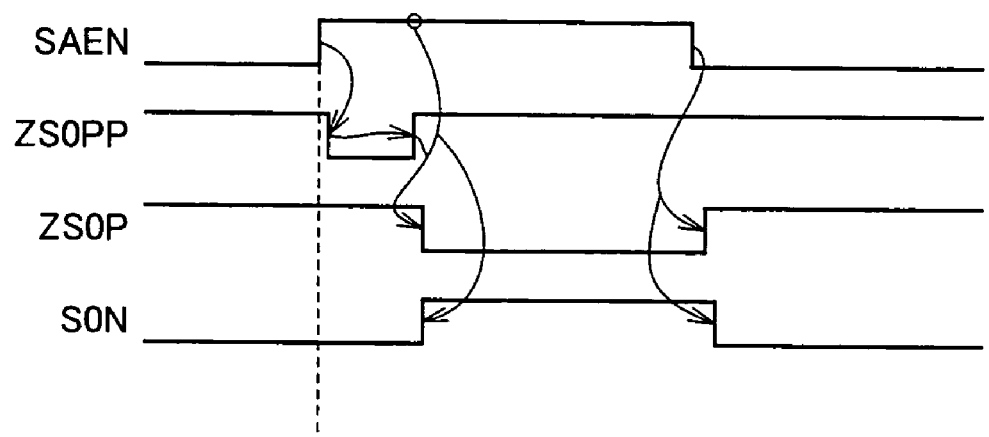
FIG. 24 is a signal waveform diagram representing an operation of the sense activation signal generation portion.

FIG. 24 is a signal waveform diagram representing an operation of the sense control signal generating portion shown in FIG. 23. Now, the operation of the sense amplifier activation signal generating portion shown in FIG. 23 will be described with reference to FIG. 24.

When a predetermined time elapses since an active cycle started, sense amplifier activation signal SAE is activated. According to sense amplifier activation signal SAEN being active, one-shot pulse generating circuit 120 generates a signal at the L level for a predetermined time period. Level conversion circuit 122 performs no logical level conversion, and performs only voltage level conversion. Thus, P assisting sense activation signal ZS0PP is maintained at the L level for a predetermined time period. For the time period in which the output signal of one-shot pulse generating circuit 120 is maintained at the L level, P-sense activation signal ZS0P from NAND gate 124 is maintained at the H level. When the output signal from one-shot pulse generating circuit 120 rises to the H level, P-sense activation signal ZS0P falls to L level when the delay time of delay circuit 126 elapses, N-sense activation signal S0N from AND gate 128 is activated. When sense amplifier signal SAEN is inactivated, P-sense amplifier activation signal ZS0P from NAND gate 124 returns to the H level and in addition, N-sense activation signal S0N from AND gate 128 falls to the L level.

The delay time of delay circuit 126 may be set equal to the pulse width of the pulse signal generated from one-shot pulse generating circuit 120, so that P-sense activation signal ZS0P and N-sense activation signal S0N can be activated at the same timing.

Also, in the signal waveform diagram shown in FIG. 22, N-sense activation signal S0N may be activated at an suitable time instance between the times T0 and T1.

The inactive time period of P-sense assisting drive signal ZS0PP and the active time period of P-sense activation signal ZS0P may be overlapped.

P and N-sense assisting drive transistors are formed of thick film MOS transistors and have small absolute values of the threshold voltages so that they can drive sense drive signal lines at high speed in initial sensing.

As described so far, according to the third embodiment of the present invention, the sense drive signal line is over-driven in initial sensing operation, and therefore fluctuations of the potential of the sense drive signal line can be suppressed to perform stable sensing operation.

Such over-driving can alleviate the restriction on the threshold voltage absolute values of the MOS transistors in the sense amplifiers, and reduces off leakage current during activation of the sense amplifiers.

Particularly, by performing initial sensing operation along the charge confinement method, the degree of the change in potential of this sense drive signal line can be reduced, thereby certainly increasing the operation margin at the start of sensing operation. This can ensure the sensing operation margin.

By applying the present invention to a DRAM-cell-based semiconductor memory device, it becomes possible to implement a memory array having a small area and high reliability and also certainly ensure the sensing operation margin to enable stable sensing operation.

Although the present invention has been described and shown in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory array including a plurality of memory cells each including a capacitor for storing information, the plurality of memory cells being arranged in rows and columns;
a plurality of sense amplifier circuits arranged corresponding to the memory cell columns of the memory array, for amplifying and latching storage data in a selected memory cell in said memory array, the sense amplifier circuits each including a first insulated gate type field effect transistor having a first gate insulating film thickness; and
peripheral circuitry for performing at least an operation related to selection of the memory cell in said memory array, said peripheral circuitry being arranged outside said memory array and including a second insulated gate type field effect transistor having a second gate insulating film thickness thinner than said first gate insulating film thickness,
wherein said memory array is divided into a plurality of blocks by a plurality of sense amplifier bands and a plurality of sub word line driver bands in both directions of the rows and columns,
in each sense amplifier band, the sense amplifier circuits are arranged being shared between adjacent, corresponding blocks and corresponding to the memory cell columns in the corresponding blocks,
in each sub word driver band, sub word line drivers for driving sub word lines in corresponding blocks are arranged, and
each sub word line is connected to the memory cells aligned in the direction of rows in a corresponding block, and main word lines are arranged such that each main word line is arranged commonly to the blocks aligned in the direction of the rows and corresponding to a predetermined number of sub word lines in each block in the blocks aligned in the direction of rows, and
said semiconductor memory device further comprises sense activation drivers, arranged in cross regions where the sense amplifier bands and the sub word driver bands intersect with each other, each for supplying, when activated, a sense operation power supply voltage to the sense amplifier circuits arranged in a corresponding sense amplifier band, wherein
each of said sense activation drivers includes:
a first insulated gate sensing drive transistor of a first conductivity type rendered conductive in response to a first sense amplifier activation signal received at a gate thereof and supplying, when conductive, a first voltage to the corresponding sense amplifier circuits as said sense operation power supply voltage; and
a second insulated gate sensing drive transistor of said first conductivity type receiving, at a gate thereof, a second sense amplifier activation signal which is activated later than activation of said first sense amplifier activation signal and responsive thereto for being rendered conductive to supply a second voltage to the corresponding sense amplifier circuits as said sense operation power supply voltage, said second voltage being smaller in absolute value than said first voltage, and said second voltage being at a voltage level corresponding to one of high level data and low level data of stored data in the memory cells.

2. The semiconductor memory device according to claim 1, further comprising:
bit line peripheral circuits arranged corresponding to said memory cell columns and formed of third insulated gate type field effect transistors, and coupled to bit lines arranged for corresponding memory cells columns, a threshold voltage of the first insulated gate type field effect transistor being smaller in absolute value than a threshold voltage of the third insulated gate type field effect transistor.

3. The semiconductor memory device according to claim 1, further comprising:
setting circuitry for setting, when said first sense amplifier activation signal is activated, connections between the sense amplifier circuits and bit lines arranged in corresponding columns to a high resistance state.

4. The semiconductor memory device according to claim 3, wherein
said setting circuitry includes bit line isolation gate transistors for connecting the bit lines to corresponding sense amplifier circuits, the bit line isolation gate transistor being set to the high resistance state when the first insulated gate sensing drive transistor is conductive.

5. The semiconductor memory device according to claim 1, further comprising:
column selecting gate circuits arranged corresponding to the sense amplifier circuits and connecting corresponding sense amplifier circuits to an internal data line according to a column selection signal, said column selection gate circuits being constituted by transistors which are the same as the first insulated gate type field effect transistors having said first gate insulating film thickness.

6. A semiconductor memory device comprising:
a memory array comprising a plurality of memory blocks each including a plurality of memory cells arranged in rows and columns, said memory blocks being aligned in row and column directions, and memory blocks aligned in the row direction constituting a row block;
a plurality of pairs of bit lines arranged corresponding to the memory cell columns in each memory block and connected to the memory cells in corresponding columns;
a plurality of sense amplifier bands placed corresponding to the row blocks and being shared by adjacent row blocks, each said sense amplifier band including a plurality of sense amplifier circuits arranged corresponding to the memory cell columns in a corresponding row block and sensing and amplifying, when activated, data in selected memory cells in the corresponding row block, and a sense amplifier driver for activating the sense amplifier circuits of a corresponding sense amplifier band, each of said sense activation drivers including (i) a first insulated gate sensing drive transistor of a first conductivity type rendered conductive in response to a first sense amplifier activation signal received at a gate thereof and supplying, when conductive, a first voltage to the corresponding sense amplifier circuits as a sense operation power supply voltage, and (ii) a second insulated gate sensing drive transistor of said first conductivity type rendered conductive receiving, at a gate thereof, a second sense amplifier activation signal which is activated later than activation of said first sense amplifier activation signal and responsive thereto for being rendered conductive to supply a second voltage to the corresponding sense amplifier circuits as said sense operation power supply voltage, said second voltage being smaller in absolute value than said first voltage, and said second voltage being at a voltage level corresponding to one of high level data and low level data of stored data in the memory cells;

a plurality of bit line peripheral circuits, provided corresponding to the bit lines in each memory block and in a corresponding sense amplifier band, each for performing a predetermined operation, a sense amplifier in-band circuit, comprised of the sense amplifier circuits, the sense amplifier driver and the bit line peripheral circuits arranged in the corresponding sense amplifier band, including in-band insulated gate type field effect transistors of a common gate insulating film thickness as components, the first insulated gate type field effect transistors of the first conductivity type constituting the sense amplifier circuits having threshold voltage smaller in absolute value than the in-band insulated gate type field effect transistors of the first conductivity type constituting the bit line peripheral circuits have; and an array peripheral circuit arranged corresponding to the memory array, for performing an operation related to selection of a memory cell in said memory array, said array peripheral circuit including, as components thereof, periphery insulated gate type field effect transistors being smaller in gate insulating film thickness than said in-band insulated gate type field effect transistors.

* * * * *